US010777233B1

(12) United States Patent
Nam et al.

(10) Patent No.: US 10,777,233 B1
(45) Date of Patent: Sep. 15, 2020

(54) NONVOLATILE MEMORY DEVICE

(71) Applicant: Samsung Electronics Co., Ltd., Suwon-si (KR)

(72) Inventors: Sang-Wan Nam, Hwaseong-si (KR); Euihyun Cheon, Suwon-si (KR); Byungjun Min, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/590,326

(22) Filed: Oct. 1, 2019

(30) Foreign Application Priority Data

Mar. 26, 2019 (KR) .................. 10-2019-0034572

(51) Int. Cl.

| G11C 5/06 | (2006.01) |
|---|---|
| G11C 16/16 | (2006.01) |
| G11C 7/18 | (2006.01) |
| G11C 16/30 | (2006.01) |
| G11C 16/08 | (2006.01) |

(52) U.S. Cl.
CPC .............. *G11C 5/063* (2013.01); *G11C 7/18* (2013.01); *G11C 16/08* (2013.01); *G11C 16/16* (2013.01); *G11C 16/30* (2013.01)

(58) Field of Classification Search
None
See application file for complete search history.

(56) References Cited

U.S. PATENT DOCUMENTS

| 7,057,915 | B2 | 6/2006 | Futatsuyama |
| 7,852,675 | B2 | 12/2010 | Maejima |
| 8,488,381 | B2 | 7/2013 | Kim et al. |
| 8,971,114 | B2 | 3/2015 | Kang et al. |
| 9,123,425 | B2 | 9/2015 | Dong et al. |
| 9,202,578 | B2 | 12/2015 | Rhie |
| 9,318,201 | B2 | 4/2016 | Ahn et al. |
| 9,595,331 | B1 | 3/2017 | Lee et al. |
| 9,922,717 | B1 | 3/2018 | Maejima |
| 2010/0271862 | A1* | 10/2010 | Yoon .................. G11C 8/12 365/148 |
| 2013/0044531 | A1* | 2/2013 | Baek .................. H01L 27/228 365/72 |
| 2013/0215679 | A1* | 8/2013 | Lee .................. G11C 16/0483 365/185.17 |

\* cited by examiner

*Primary Examiner* — Tan T. Nguyen
(74) *Attorney, Agent, or Firm* — Muir Patent Law, PLLC

(57) ABSTRACT

A nonvolatile memory device includes a first memory block including a plurality of cell transistors interconnected with a plurality of ground selection lines, a plurality of word lines, and a plurality of string selection lines, which are stacked in a direction perpendicular to a substrate, a block selecting circuit that is connected with the plurality of ground selection lines, the plurality of word lines, and the plurality of string selection lines, and provides corresponding driving voltages to the plurality of ground selection lines, the plurality of word lines, and the plurality of string selection lines in response to a block selection signal, respectively, and a block unselecting circuit that is connected only with specific string selection lines of the plurality of string selection lines, and provides an off-voltage only to the specific string selection lines in response to a block unselection signal.

20 Claims, 16 Drawing Sheets

FIG. 6

| [PGM] | Selected BLK | Unselected BLK |
|---|---|---|
| BL1/BL2 | VCC/VSS | VCC/VSS |
| SSL1a/SSL1b | VSSL1a/VSSL1b | FLOATING/VOFF |
| SSL2a/SSL2b | VSSL2a/VSSL2b | FLOATING/VOFF |
| Block Selecting Circuit | Turn-on | Turn-off |
| Block Unselecting Circuit | Turn-off | Turn-on |

NONVOLATILE MEMORY DEVICE

CROSS-REFERENCE TO RELATED APPLICATIONS

This application claims priority under 35 U.S.C. § 119 to Korean Patent Application No. 10-2019-0034572 filed on Mar. 26, 2019, in the Korean Intellectual Property Office, the disclosures of which are incorporated by reference herein in their entireties.

BACKGROUND

1. Technical Field

Embodiments of the inventive concept described herein relate to a semiconductor memory, and more particularly, relate to a nonvolatile memory device.

2. Discussion of the Related Art

A semiconductor memory device is classified as a volatile memory device, in which stored data disappear when a power is turned off, such as a static random access memory (SRAM) or a dynamic random access memory (DRAM), or a nonvolatile memory device, in which stored data are retained even when a power is turned off, such as a flash memory device, a phase-change RAM (PRAM), a magnetic RAM (MRAM), a resistive RAM (RRAM), or a ferroelectric RAM (FRAM).

The flash memory device is being widely used as a high-capacity storage medium. Nowadays, as a three-dimensional flash memory device is developed, the degree of integration of the flash memory device is being improved, and various techniques for controlling the flash memory device having the improved degree of integration are being developed.

SUMMARY

Embodiments of the inventive concept provide a nonvolatile memory device capable of reducing costs by decreasing the area of a peripheral circuit (in particular, a row decoder) of the nonvolatile memory device.

According to an exemplary embodiment, a nonvolatile memory device includes a first memory block including a plurality of cell transistors interconnected with a plurality of ground selection lines, a plurality of word lines, and a plurality of string selection lines, which are stacked in a direction perpendicular to a substrate, a block selecting circuit that is connected with the plurality of ground selection lines, the plurality of word lines, and the plurality of string selection lines, and provides corresponding driving voltages to the plurality of ground selection lines, the plurality of word lines, and the plurality of string selection lines in response to a block selection signal corresponding to the first memory block, respectively, and a block unselecting circuit that is connected only with specific string selection lines of the plurality of string selection lines, and provides an off-voltage only to the specific string selection lines in response to a block un-selection signal that does not correspond to the first memory block. The number of the specific string selection lines may be smaller than the number of the plurality of string selection lines.

According to an exemplary embodiment, a nonvolatile memory device includes a first cell string that includes a plurality of first cell transistors connected in series between a common source line and a first bit line and stacked each other in a direction perpendicular to a substrate, a second cell string that includes a plurality of second cell transistors connected in series between the common source line and the first bit line and stacked each other in the direction perpendicular to the substrate, a block selecting circuit that is connected with the first cell string and the second cell string through a plurality of signal lines, and provides corresponding driving voltages to the plurality of signal lines in response to a block selection signal, and a block unselecting circuit that is connected only with specific signal lines of the plurality of signal lines, and provides an off-voltage to the specific signal lines in response to a block un-selection signal. Remaining signal lines of the plurality of signal lines other than the specific signal lines include at least one first string selection line connected with the first cell string and at least one second string selection line connected with the second cell string.

According to an exemplary embodiment, a nonvolatile memory device includes a first memory block including a plurality of cell transistors interconnected with a plurality of string selection lines, a plurality of word lines, and a plurality of ground selection lines, which are stacked in a direction perpendicular to a substrate, a block decoder that activates a block selection signal and a block un-selection signal based on a first address corresponding to the first memory block and a second address that does not correspond to the first memory block, respectively, the first and second addresses receiving from an external device, a plurality of path transistors that provide corresponding driving voltages to the plurality of string selection lines, the plurality of word lines, and the plurality of ground selection lines respectively in response to the activating of the block selection signal, and a plurality of non-selection path transistors that provide an off-voltage to specific string selection lines of the plurality of string selection lines in response to the activating of the block un-selection signal. The number of the plurality of non-selection path transistors is smaller than the number of the plurality of string selection lines.

BRIEF DESCRIPTION OF THE FIGURES

The above and other objects and features of the inventive concept will become apparent by describing in detail exemplary embodiments thereof with reference to the accompanying drawings.

FIG. 6 is a diagram illustrating a program bias of the row decoder of FIG. 5 according to example embodiments.

DETAILED DESCRIPTION

Below, embodiments of the inventive concept may be described in detail and clearly to such an extent that an ordinary one in the art easily implements the inventive concept.

Figure 1:
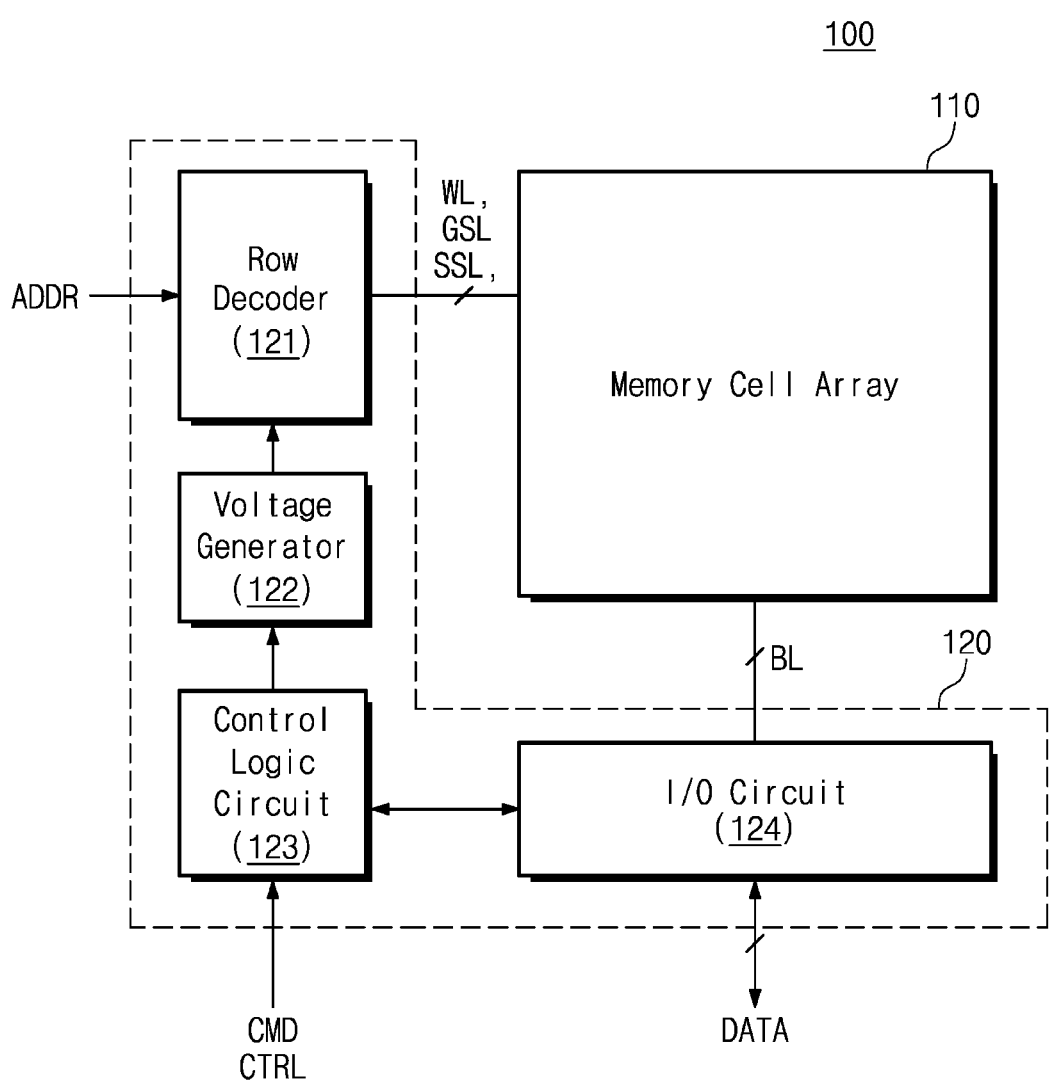
FIG. 1 is a block diagram illustrating a nonvolatile memory device according to an embodiment of the inventive concept.

FIG. 1 is a block diagram illustrating a nonvolatile memory device according to an embodiment of the inventive concept.

Referring to FIG. 1, a nonvolatile memory device 100 may include a memory cell array 110 and a peripheral circuit 120. For convenience of description, below, a description will be given as the nonvolatile memory device 100 is a NAND flash memory device, but the inventive concept is not limited thereto.

The memory cell array 110 may include a plurality of memory blocks. Each of the memory blocks may include a plurality of cell strings. Each of the plurality of cell strings may include a plurality of serially-connected cell transistors, which are connected with string selection lines SSL, word lines WL, and ground selection lines GSL.

In an exemplary embodiment, the cell transistors of the memory cell array 110 may be stacked in a direction that is perpendicular to a semiconductor substrate. For example, the memory cell array 110 may include three-dimensional memory blocks.

The peripheral circuit 120 may include a row decoder 121, a voltage generator 122, a control logic circuit 123, and an input/output circuit 124. In an exemplary embodiment, the memory cell array 110 may be formed in a cell area of the semiconductor substrate, and the peripheral circuit 120 may be formed in a peripheral area, which is physically separated from the cell area, of the semiconductor substrate. Alternatively, the peripheral circuit 120 may be formed on the semiconductor substrate, and the memory cell array 110 may be stacked on the peripheral circuit 120. For example, the nonvolatile memory device 100 may be formed in a cell-on-peripheral (COP) structure. However, the inventive concept is not limited thereto. For example, the nonvolatile memory device 100 may be implemented in various shapes.

The row decoder 121 may be connected with the memory cell array 110 through the string selection lines SSL, the word lines WL, and the ground selection lines GSL. The row decoder 121 may receive an address ADDR from an external device (e.g., a memory controller or a host device). In an exemplary embodiment, the address ADDR may include various address information such as a block address, a row address, a column address, etc. The row decoder 121 may decode the received address ADDR to control voltages of the string selection lines SSL, the word lines WL, and the ground selection lines GSL.

The voltage generator 122 may generate various voltages (e.g., a plurality of program voltages, a plurality of verification voltages, a plurality of pass voltages, a plurality of selection read voltages, a plurality of non-selection read voltages, and a plurality of block selection voltages) necessary for the nonvolatile memory device 100 to operate. The voltages generated from the voltage generator 122 may be provided to the row decoder 121.

The control logic circuit 123 may receive a command CMD or a control signal CTRL from the external device (e.g., a memory controller or a host device) and may control the row decoder 121, the voltage generator 122, and the input/output circuit 124 based on the received command CMD or the received control signal CTRL.

The input/output circuit 124 may be connected with the memory cell array 110 through a plurality of bit lines BL. The input/output circuit 124 may read data "DATA" stored in the memory cell array 110 through the plurality of bit lines BL and may output the read data "DADA" to the external device. Alternatively, the input/output circuit 124 may receive the data "DATA" from the external device and may store the received data "DATA" in the memory cell array 110 through the plurality of bit lines BL.

Although not shown in FIG. 1, the input/output circuit 124 may include a column decoder connected to the memory cell array 110 through the plurality of bit lines BL. The column decoder may receive a column address from the external device and decode the received column address to control the plurality of bit lines BL. The input/output circuit 124 may also include page buffers connected to the plurality of bit lines BL to temporarily store data received from the external device or read from the memory cell array 110 through the plurality of bit lines BL.

In an exemplary embodiment, the nonvolatile memory device 100 may operate in a specific unit (e.g., a block unit, a sub-block unit, a word line unit, or a page unit). For example, when a page-based program operation is performed on a first word line of the nonvolatile memory device 100, the row decoder 121 may select at least one memory block of the plurality of memory blocks included in the memory cell array 110 based on the address ADDR (in particular, a block address) received from the external device. The row decoder 121 may control the string selection lines SSL, the word lines WL, the ground selection lines GSL, and the bit lines BL based on the address ADDR (in particular, a row address) received from the external device such that a program operation is performed on the first word line of the selected memory block.

In an exemplary embodiment, the plurality of memory blocks may share the bit lines BL. For example, during the program operation, a bit line voltage may be provided to the remaining memory blocks (i.e., unselected memory blocks) of the plurality of memory blocks other than the selected memory block. Specific cell transistors (e.g., string selection transistors) of the unselected memory blocks may be turned off such that the bit line voltage is not applied to the unselected memory blocks. The row decoder 121 may provide a specific voltage to control lines (e.g., a part of the string selection lines SSL) connected with the specific string selection transistors such that the specific cell transistors are turned off. For example, when the number of the string selection lines SSL is Y, the number (e.g., X) of the part of the string selection lines SSL is equal to 1 or less than Y. Herein, X may be a positive integer equal to or greater than 1 and Y may be a positive integer greater than X and equal to or greater than 2.

In an exemplary embodiment, the row decoder 121 according to an embodiment of the inventive concept may provide the specific voltage only to a specific string selection line of string selection lines of an unselected memory block. In this case, the size of the row decoder 121 may decrease because it is unnecessary to apply the specific voltage to all the string selection lines of the unselected memory block. A configuration of the row decoder 121 according to an embodiment of the inventive concept will be more precisely described with reference to accompanying drawings.

Figure 2:
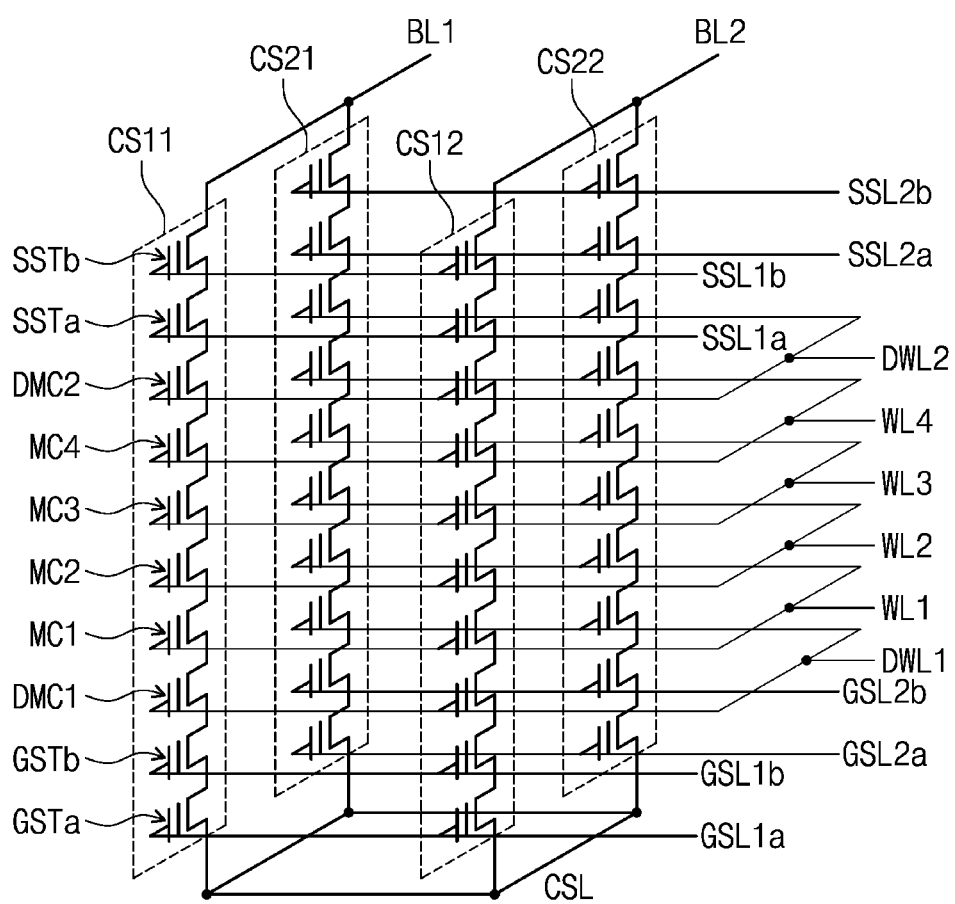
FIG. 2 is a circuit diagram illustrating a first memory block of a plurality of memory blocks included in a memory cell array of the nonvolatile memory device of FIG. 1.

FIG. 2 is a circuit diagram illustrating a first memory block of a plurality of memory blocks included in the memory cell array 110 in FIG. 1. In an exemplary embodiment, a first memory block BLK1 of a three-dimensional structure will be described with reference to FIG. 2, but the inventive concept is not limited thereto. For example, the memory cell array 110 includes a plurality of memory blocks, each of which has a similar structure to the first memory block BLK1 of FIG. 2. In an exemplary embodiment, the first memory block BLK1 illustrated in FIG. 2 may correspond to a physical erase unit of the nonvolatile memory device 100, but the inventive concept is not limited thereto. For example, a physical erase unit may be changed to a page unit, a word line unit, a sub block unit, etc.

Referring to FIGS. 1 and 2, the first memory block BLK1 may include a plurality of cell strings CS11, CS12, CS21, and CS22. The cell strings CS11, CS12, CS21, and CS22 may be arranged along a row direction and a column direction. For brevity of illustration, the four cell strings CS11, CS12, CS21, and CS22 are illustrated in FIG. 2, but the inventive concept is not limited thereto. For example, the number of cell strings may increase or decrease in the row direction or the column direction.

Cell strings positioned at the same column from among the plurality of cell strings CS11, CS12, CS21, and CS22 may be connected with the same bit line. For example, the cell strings CS11 and CS21 may be connected with a first bit line BL1, and the cell strings CS12 and CS22 may be connected with a second bit line BL2.

Each of the plurality of cell strings CS11, CS12, CS21, and CS22 may include a plurality of cell transistors. Each of the plurality of cell transistors may include a charge trap flash (CTF) memory cell. The plurality of cell transistors may be stacked in a height direction that is a direction perpendicular to a plane (e.g., a semiconductor substrate (not illustrated)) defined by the row direction and the column direction.

In each cell string, the plurality of cell transistors may be connected in series between a corresponding bit line (e.g., BL1 or BL2) and a common source line CSL. For example, the plurality of cell transistors may include string selection transistors SSTb and SSTa, dummy memory cells DMC1 and DMC2, memory cells MC1 to MC4, and ground selection transistors GSTa and GSTb. The serially-connected string selection transistors SSTb and SSTa may be provided between serially-connected memory cells MC1 to MC4 and a corresponding bit line (e.g., BL1 or BL2). The serially-connected ground selection transistors GSTa and GSTb may be provided between the serially-connected memory cells MC1 to MC4 and the common source line CSL.

In an exemplary embodiment, the second dummy memory cell DMC2 may be further provided between the serially-connected string selection transistors SSTb and SSTa and the serially-connected memory cells MC1 to MC4, and the first dummy memory cell DMC1 may be further provided between the serially-connected memory cells MC1 to MC4 and the serially-connected ground selection transistors GSTb and GSTa.

Herein, the second dummy memory cell DMC2 is coupled between the string selection transistor SSTa and the memory cell MC4 and the first dummy memory cell DMC1 is coupled between the ground selection transistor GSTb and the memory cell MC1. For example, the first and second dummy memory cells DMC1 and DMC2 may have similar or identical structures as the memory cells MC1 to MC4 and may be formed with the same processes. Each of the first and second dummy memory cells DMC1 and DMC2 may be activated by first and second dummy word lines DWL1 and DWL2, respectively, but may not have any "data" stored or read from an external device. For instance, data stored in a dummy memory cell electrically connected to a dummy word line may not be transmitted outside of the memory cell array through any selection signals provided by the column decoder, as is the case for normal memory cells (e.g., memory cells MC1 to MC4).

In an exemplary embodiment, each of the plurality of cell strings CS11, CS12, CS21, and CS22 may not include one or both of the first and second dummy memory cells DMC1 and DMC2. For example, the serially-connected memory cells MC1 to MC4 may be directly connected to the serially-connected string selection transistors SSTb and SSTa and the serially-connected ground selection transistors GSTb and GSTa without the first and second dummy memory cells DMC1 and DMC2.

In the plurality of cell strings CS11, CS12, CS21, and CS22, memory cells positioned at the same height from among the memory cells MC1 to MC4 may share the same word line. For example, the first memory cells MC1 of the plurality of cell strings CS11, CS12, CS21, and CS22 may be positioned at the same height from the substrate (not illustrated) and may share a first word line WL1. The second memory cells MC2 of the plurality of cell strings CS11, CS12, CS21, and CS22 may be positioned at the same height from the substrate (not illustrated) and may share a second word line WL2. Likewise, the third memory cells MC3 of the plurality of cell strings CS11, CS12, CS21, and CS22 may be positioned at the same height from the substrate (not illustrated) and may share a third word line WL3, and the fourth memory cells MC4 of the plurality of cell strings CS11, CS12, CS21, and CS22 may be positioned at the same height from the substrate (not illustrated) and may share a fourth word line WL4.

In the plurality of cell strings CS11, CS12, CS21, and CS22, dummy memory cells positioned at the same height from among the dummy memory cells DMC1 and DMC2 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

In the plurality of cell strings CS11, CS12, CS21, and CS22, string selection transistor positioned at the same height and the same row from among string selection transistors SSTb and SSTa may be connected with the same string selection line. For example, the string selection transistors SSTb of the cell strings CS11 and CS12 may be connected with a string selection line SSL1b, and the string selection transistors SSTa of the cell strings CS11 and CS12 may be connected with a string selection line SSL1a. The string selection transistors SSTb of the cell strings CS21 and CS22 may be connected with a string selection line SSL2b, and the string selection transistors SSTa of the cell strings CS21 and CS22 may be connected with a string selection line SSL2a.

Although not illustrated in drawings, in the plurality of cell strings CS11, CS12, CS21, and CS22, string selection transistors positioned at the same row from among the string selection transistors SSTa and SSTb may share the same string selection line. For example, the string selection transistors SSTb and SSTa of the cell strings CS11 and CS12 may share a first string selection line, and the string selection transistors SSTb and SSTa of the cell strings CS21 and CS22 may share a second string selection line different from the first string selection line.

In the plurality of cell strings CS11, CS12, CS21, and CS22, ground selection transistors positioned at the same height and the same row from among the ground selection transistors GSTb and GSTa may be connected with the same ground selection line. For example, the ground selection transistors GSTb of the cell strings CS11 and CS12 may be connected with a ground selection line GSL1b, and the ground selection transistors GSTa of the cell strings CS11 and CS12 may be connected with a ground selection line GSL1a. The ground selection transistors GSTb of the cell strings CS21 and CS22 may be connected with a ground selection line GSL2b, and the ground selection transistors GSTa of the cell strings CS21 and CS22 may be connected with a ground selection line GSL2a.

Although not illustrated in drawings, in each of the plurality of cell strings CS11, CS12, CS21, and CS22, the ground selection transistors GSTa and GSTb may share the same ground selection line. In the plurality of cell strings CS11, CS12, CS21, and CS22, ground selection transistors positioned at the same height from among the ground selection transistors GSTa and GSTb may share the same ground selection line. Alternatively, in the plurality of cell strings CS11, CS12, CS21, and CS22, ground selection transistors positioned at the same row from among the ground selection transistors GSTa and GSTb may share the same ground selection line.

In an exemplary embodiment, the first memory block BLK1 illustrated in FIG. 2 is exemplary. For example, the number of cell strings may increase or decrease, and the number of rows of cell strings and the number of columns of cell strings may increase or decrease according to the number of cell strings. Also, in the first memory block BLK1, the number of cell strings (GST, MC, DMC, SST, etc.) may increase or decrease, and the height of the first memory block BLK1 may increase or decrease according to the number of cell transistors. Also, the number of lines (GSL, WL, DWL, SSL, etc.) connected with cell transistors may increase or decrease according to the number of cell transistors.

Figure 3:
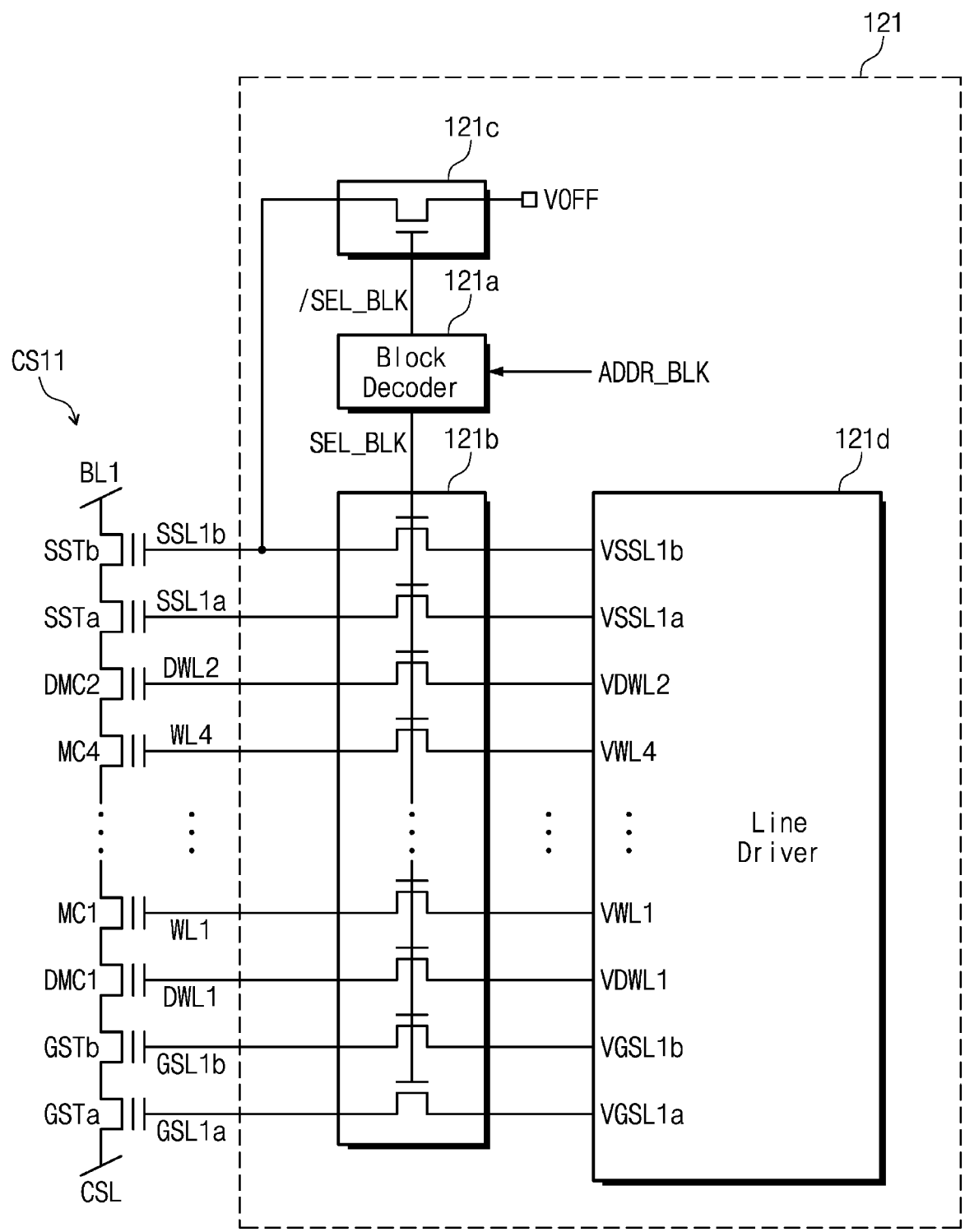
FIG. 3 is a diagram illustrating a row decoder of the nonvolatile memory device of FIG. 1 according to example embodiments.

FIG. 3 is a diagram illustrating the row decoder 121 of FIG. 1 according to example embodiments. For brevity of illustration, a configuration of the row decoder 121 will be described with reference to one cell string CS11 among the plurality of cell strings CS11, CS12, CS21, and CS22 of the first memory block BLK1. Also, components that are unnecessary to describe the row decoder 121 are omitted.

Below, to describe various embodiments of the inventive concept clearly, an example in which an operation of the nonvolatile memory device 100 is performed based on a memory block unit will be described. That is, in the following embodiments, an operation of the nonvolatile memory device 100 will be described with regard to a selected memory block and an unselected memory block, but the inventive concept is not limited thereto. For example, there may be performed an operation of controlling various lines (e.g., GSL, WL, DWL, SSL, etc.) connected with the selected memory block based on an operation kind (e.g., a program operation, a read operation, or an erase operation) of the nonvolatile memory device 100.

Referring to FIGS. 1 to 3, the row decoder 121 may include a block decoder 121a, a block selecting circuit 121b, a block unselecting circuit 121c, and a line driver 121d.

The block decoder 121a may decode a block address ADDR_BLK (e.g., included in the address ADDR) to output a block selection signal SEL_BLK. For example, the block decoder 121a may determine whether the block address ADDR_BLK corresponds to the first memory block BLK1 including the cell string CS11. When the block address ADDR_BLK corresponds to the first memory block BLK1, the first memory block BLK1 may be a selected block; when the block address ADDR_BLK does not correspond to the first memory block BLK1, the first memory block BLK1 may be an unselected block. That is, the block decoder 121a may determine whether the first memory block BLK1 is a selected block or an unselected block, based on the block address ADDR_BLK.

When the first memory block BLK1 is a selected block, the block decoder 121a may output the block selection signal SEL_BLK of "logical high" (e.g., activating of the block selection signal SEL_BLK) and output a block un-selection signal /SEL_BLK of "logical low" (e.g., deactivating of the block un-selection signal /SEL_BLK). When the first memory block BLK1 is an unselected block, the block decoder 121a may output the block selection signal SEL_BLK of "logical low" (e.g., deactivating of the block selection signal SEL_BLK) and output the block un-selection signal /SEL_BLK of "logical high" (e.g., activating of the block un-selection signal /SEL_BLK). In example embodiments, the block un-selection signal /SEL_BLK may be generated by inverting the block selection signal SEL_BLK. However, the inventive concept is not limited thereto. For example, the level of the block selection signal SEL_BLK may be variously changed or modified.

The block selecting circuit 121b may be connected between the signal lines SSL1a, SSL1b, DWL1, DWL2, WL1 to WL4, GSL1a, and GSL1b (i.e., including string selection lines SSL1a and SSL1b, the dummy word lines DWL1 and DWL2, the word lines WL1 to WL4, and the ground selection lines GSL1a and GSL1b), which are connected with the cell string CS11 of the first memory block BLK1, and the line driver 121d.

The block selecting circuit 121b may operate in response to the block selection signal SEL_BLK. For example, the block selecting circuit 121b may include a plurality of path transistors that are respectively connected between the plurality of signal lines (e.g., SSL1a, SSL1b, DWL2, WL4 . . . WL1, DWL1, GSL1b, and GSL1a) and the line driver 121d. The plurality of path transistors of the block selecting circuit 121b may be turned on in response to the block selection signal SEL_BLK of "logical high". In this case, driving voltages (e.g., VSSL1a, VSSL1b, VDWL2, VWL4 . . . VWL1, VDWL1, VGSL1b, and VGSL1a) from the line driver 121d may be provided to corresponding signal lines (e.g., SSL1a, SSL1b, DWL2, WL4 . . . WL1, DWL1, GSL1b, GSL1a), respectively.

The plurality of path transistors of the block selecting circuit 121b may be turned off in response to the block selection signal SEL_BLK of "logical low". In this case, the corresponding lines (e.g., SSL1a, SSL1b, DWL2, WL4 . . . WL1, DWL1, GSL1b, GSL1a) may be floated.

For example, when the first memory block BLK1 is a selected block, the block selecting circuit 121b may provide corresponding driving voltages to various lines connected with the first memory block BLK1; when the first memory block BLK1 is an unselected block, the block selecting circuit 121b may float the various lines connected with the first memory block BLK1 or may block the corresponding driving voltages to be provided to the various lines.

In an exemplary embodiment, the driving voltages (e.g., VSSL1a, VSSL1b, VDWL2, VWL4 . . . VWL1, VDWL1, VGSL1b, VGSL1a) from the line driver 121d may be variously changed or modified according to an operation kind (e.g., a program operation, a verification operation, a read operation, or an erase operation) of the nonvolatile memory device 100, whether a string is selected or is not selected, or whether a word line is selected or is not selected.

In an exemplary embodiment, when the first memory block BLK1 is an unselected block, a part of the string selection transistors SSTb and SSTa may be turned off such that a voltage provided to a bit line (e.g., BL1) is not applied to the first memory block BLK1.

For example, the block unselecting circuit 121c may include a non-selection path transistor connected between an off-voltage VOFF and the first string selection line SSL1b of the string selection lines SSL1a and SSL1b connected with the first memory block BLK1, and the non-selection path transistor may operate in response to the block un-selection signal /SEL_BLK. In an exemplary embodiment, the off-voltage VOFF may be a ground voltage GND or a negative voltage.

For example, the block unselecting circuit 121c may be turned off when the first memory block BLK1 is a selected block and may be turned on when the first memory block BLK1 is an unselected block. When the block unselecting circuit 121c is turned on, the off-voltage VOFF may be applied to the first string selection line SSL1b, and thus, the string selection transistor SSTb connected with the first string selection line SSL1b may be turned off. In this case, a voltage of the first bit line BL1 may not be applied to the first memory block BLK1.

In an exemplary embodiment, when a specific memory block is an unselected block, a conventional nonvolatile memory device is configured to provide the off-voltage VOFF to all string selection lines associated with the specific memory block. In this case, a block unselecting circuit may include non-selection path transistors respectively connected with all string selection lines. This means an increase in the size of a row decoder.

In contrast, according to an embodiment of the inventive concept, the block unselecting circuit 121c may be connected with only some string selection lines of a plurality of string selection lines connected with one memory block (i.e., the first memory block BLK1), and the size of the row decoder 121 may be reduced.

Figure 4:
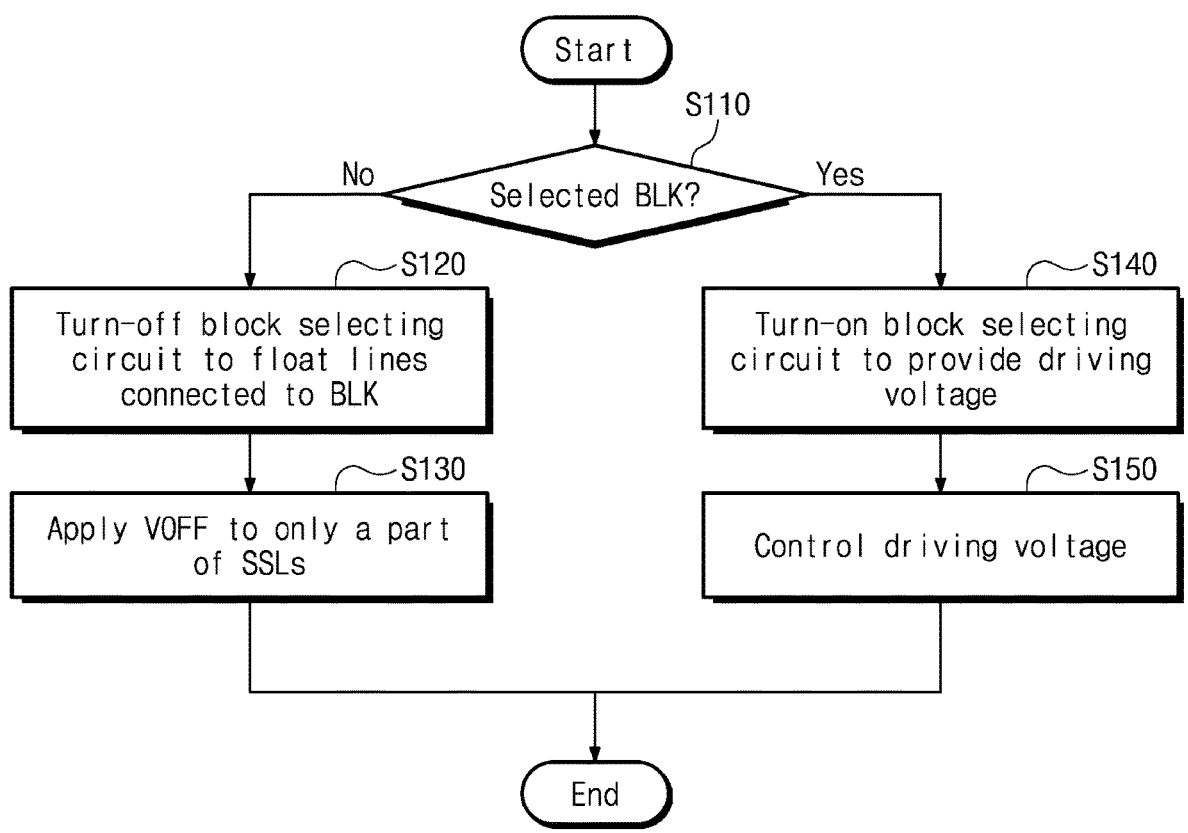
FIG. 4 is a flowchart illustrating an operation of the nonvolatile memory device of FIG. 1 according to example embodiments.

FIG. 4 is a flowchart illustrating an operation of the nonvolatile memory device 100 of FIG. 1 according to example embodiments. Below, an operation of the nonvolatile memory device 100 according to an embodiment of the inventive concept will be described with reference to the first memory block BLK1. However, the inventive concept is not limited thereto. For example, the nonvolatile memory device 100 may perform an operation with respect to a plurality of memory blocks in compliance with the flowchart of FIG. 4.

Referring to FIGS. 1 to 4, in operation S110, the nonvolatile memory device 100 may determine whether the first memory block BLK1 is a selected block. For example, the nonvolatile memory device 100 may receive the address ADDR from an external device (e.g., a memory controller or a host device) and may select at least one memory block of the plurality of memory blocks based on the received address ADDR. For example, the nonvolatile memory device 100 may determine whether the first memory block BLK1 is a selected block, based on the address ADDR received from the external device.

When the first memory block BLK1 is not a selected block (i.e., an unselected block), in operation S120, the nonvolatile memory device 100 may turn off the block selecting circuit 121b such that signal lines connected with the first memory block BLK1 are floated. For example, as described with reference to FIG. 3, when the first memory block BLK1 is an unselected block, the block decoder 121a may output the block selection signal SEL_BLK of "logical low". The block selecting circuit 121b may float signal lines connected with the first memory block BLK1 in response to the block selection signal SEL_BLK of "logical low". For example, the block selecting circuit 121b may disconnect the signal lines connected with the first memory block BLK1 from the line driver 121d.

In operation S130, the nonvolatile memory device 100 may provide the off-voltage VOFF to only some string selection lines of the string selection lines SSL. For example, as described with reference to FIG. 3, when the first memory block BLK1 is an unselected block, the block unselecting circuit 121c may be turned on in response to the block un-selection signal /SEL_BLK (e.g., activating of the block un-selection signal /SEL_BLK), and thus, the off-voltage VOFF may be provided to only a part (e.g., SSL1b) of string selection lines. In this case, because the block unselecting circuit 121c is connected only with the string selection line SSL1b of the string selection lines SSL1b and SSL1a, the off-voltage VOFF may be provided only to the string selection line SSL1b. In this case, the remaining string selection line (e.g., SSL1a) may be in a floating state.

When the first memory block BLK1 is a selected block, in operation S140, the nonvolatile memory device 100 may turn on the block selecting circuit 121b such that driving voltages are provided to the signal lines connected with the first memory block BLK1. In operation S140, the nonvolatile memory device 100 may control driving voltages that are provided to a plurality of lines connected with the first memory block BLK1.

For example, as described with reference to FIG. 3, when the first memory block BLK1 is a selected block, the block decoder 121a may output the block selection signal SEL_BLK of "logical high". The block selecting circuit 121b may be turned on in response to the block selection signal SEL_BLK of "logical high". Various driving voltages from the line driver 121d may be provided to corresponding signal lines through the turned-on block selecting circuit 121b.

In an exemplary embodiment, the driving voltages may be variously changed according to an operation kind of the nonvolatile memory device 100, whether a string is selected, whether a word line is selected, or an operating condition. In an exemplary embodiment, when the first memory block BLK1 is a selected block, the block unselecting circuit 121c may be turned off.

Figure 5:
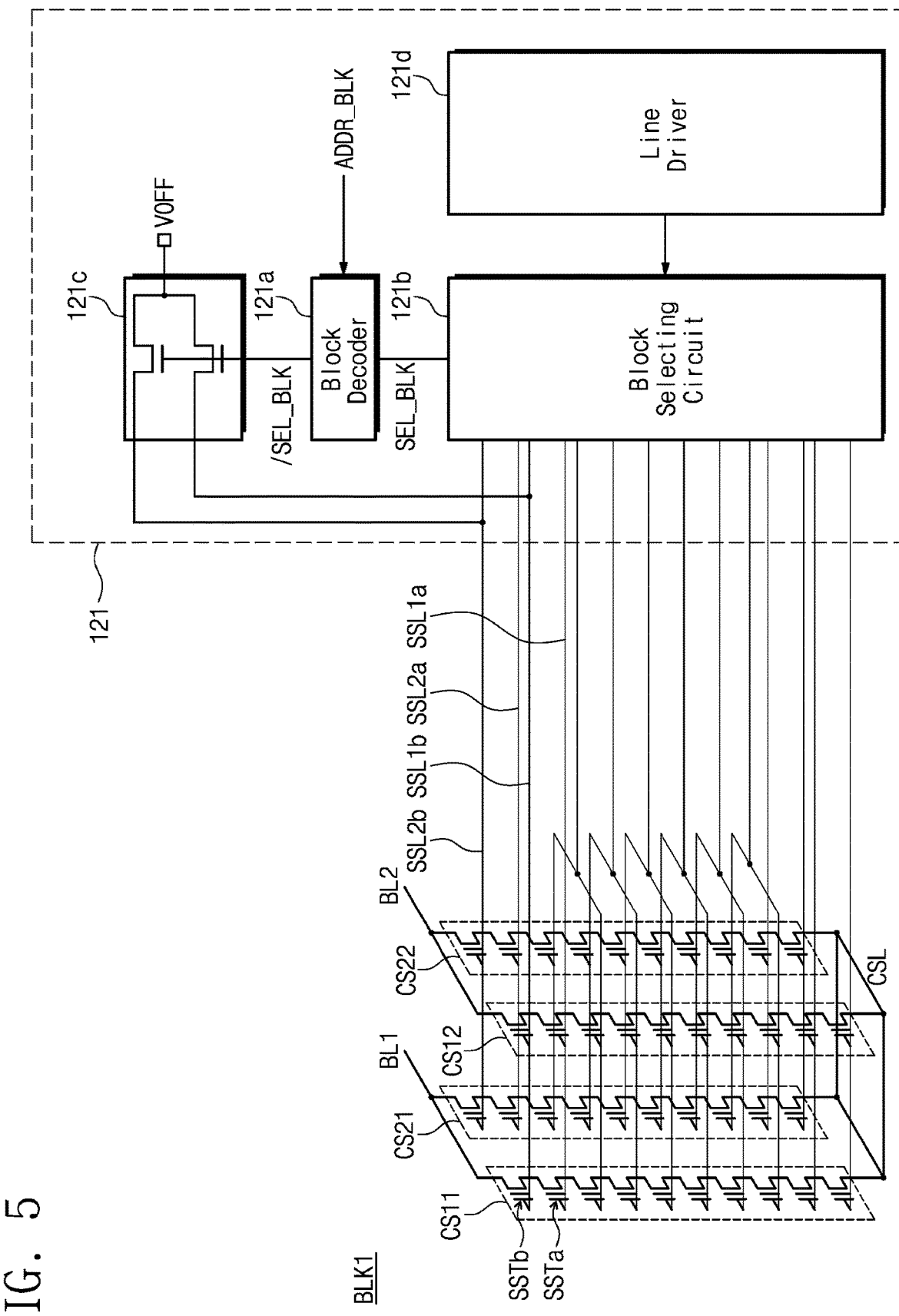
FIG. 5 is a diagram illustrating a configuration of the row decoder of FIG. 3 in detail according to example embodiments.

FIG. 5 is a block diagram illustrating a configuration of the row decoder of FIG. 3 in detail according to example embodiments. A schematic configuration of the row decoder 121 is described with reference to FIG. 3 in which only one string CS11 is illustrated, but a configuration of the row decoder 121 will be more fully described with reference to FIG. 5 in which the first memory block BLK1 is illustrated. For brevity of illustration and convenience of description, components that are unnecessary to describe the row decoder 121 are omitted, and thus, an additional description will be omitted to avoid redundancy.

Referring to FIGS. 1 to 5, the first memory block BLK1 may include the plurality of cell strings CS11, CS12, CS21, and CS22. Each of the plurality of cell strings CS11, CS12, CS21, and CS22 may include the string selection transistors SSTb and SSTa. The remaining components of the first memory block BLK1 are described with reference to FIG. 2, and thus, an additional description will be omitted to avoid redundancy.

The row decoder 121 may include the block decoder 121a, the block selecting circuit 121b, the block unselecting circuit 121c, and the line driver 121d. The block decoder 121a and the line driver 121d are described above, and thus, an additional description will be omitted to avoid redundancy.

The block selecting circuit 121b may be connected with various lines (e.g., SSL1a, SSL1b, SSL2a, and SSL2b) connected with the first memory block BLK1; in response to the block selection signal SEL_BLK, the block selecting circuit 121b may provide driving voltages from the line driver 121d to the corresponding signal lines or may block the driving voltages (or may float the corresponding signal lines).

In response to the block un-selection signal /SEL_BLK, the block unselecting circuit 121c may provide the off-voltage VOFF to some string selection lines (e.g., SSL1b and SSL2b) of the string selection lines SSL1a, SSL1b, SSL2a, and SSL2b connected with the first memory block BLK1. For example, as illustrated in FIG. 5, in response to the block un-selection signal /SEL_BLK, the block unselecting circuit 121c may provide the off-voltage VOFF only to some string selection lines SSL1b and SSL2b of the string selection lines SSL1a, SSL1b, SSL2a, and SSL2b connected with the first memory block BLK1.

In an exemplary embodiment, some string selection lines SSL1b and SSL2b connected with the block unselecting circuit 121c may be string selection lines that are connected with string selection transistors immediately adjacent to corresponding bit lines (e.g., without other intervening cell transistors positioned therebetween) and positioned at the same row from among string selection transistors. For example, as illustrated in FIG. 5, the string selection transistors SSTa of the cell strings CS11 and CS12 are in the same row and are respectively connected with the string selection line SSL1a, and the string selection transistors SSTb of the cell strings CS11 and CS12 are in the same row and are respectively connected with the string selection line SSL1b. In this case, the string selection transistors SSTb may be physically closer to the bit lines BL1 and BL2 than the string selection transistors SSTa. When the first memory block BLK1 is an unselected block, the off-voltage VOFF may be applied only to string selection lines (e.g., SSL1b and SSL2b) connected with the string selection transistors (e.g., SSTb) immediately adjacent to the bit lines BL1 and BL2.

In an exemplary embodiment, the block unselecting circuit 121c may not be connected with the remaining string selection lines (e.g., SSL1a and SSL2a). For example, when the first memory block BLK1 is an unselected block, the off-voltage VOFF may not be applied to the remaining string selection lines SSL1a and SSL2a. This may mean that the remaining string selection lines SSL1a and SSL2a are floated.

In an exemplary embodiment, as in the above description, the block unselecting circuit 121c may include non-selection path transistors configured to provide the off-voltage VOFF to specific string selection lines (e.g., SSL1b and SSL2b) in response to the block un-selection signal /SEL_BLK. In this case, the number ("2" in the embodiment of FIG. 5) of non-selection path transistors may be less than the number ("4" in the embodiment of FIG. 5) of the plurality of string selection lines SSL1a, SSL1b, SSL2a, and SSL2b connected with the first memory block BLK1.

As described above, according to an embodiment of the inventive concept, the block unselecting circuit 121c that is configured to provide the off-voltage VOFF for turning off a string selection transistor of an unselected block may be connected only with some string selection lines of a plurality of string selection lines connected with the unselected block and may be omitted with regard to the remaining string selection lines. Accordingly, even though the number of string selection transistors included in a memory block or the number of string selection lines connected with a memory block increases, the number of non-selection path transistors included in the block unselecting circuit 121c may not increase, and thus, the total size of the row decoder 121 may decrease.

FIG. 6 is a diagram illustrating a program bias of the row decoder of FIG. 5 according to example embodiments. To describe an embodiment of the inventive concept clearly, a program operation will be described with reference to a selected block and an unselected block. Also, to prevent the inventive concept from becoming ambiguous, a description will be given only with regard to biasing string selection lines of the selected block and the unselected block, and a detailed description will be omitted with regard to the remaining signal lines (e.g., WL, DWL, GSL, and CSL).

Referring to FIGS. 5 and 6, a power supply voltage VCC or a ground voltage VSS may be applied to the first and second bit lines BL1 and BL2. When the first memory block BLK1 is a selected block, as described above, the block selecting circuit 121b may be turned on, and the block unselecting circuit 121c may be turned off; thus, the driving voltages VSSL1a, VSSL1b, VSSL2a, and VSSL2b may be provided to the corresponding string selection lines SSL1a, SSL1b, SSL2a, and SSL2b. In an exemplary embodiment, the driving voltages VSSL1a, VSSL1b, VSSL2a, and VSSL2b may be variously changed according to whether the cell strings CS11, CS12, CS21, and CS22 are selected. For example, when the cell strings CS11 and CS12 are selected strings and the cell strings CS21 and CS22 are unselected strings, each of the driving voltages VSSL1a and VSSL1b may be a high voltage (e.g., VCC) for turning on the string selection transistors SSTa and SSTb of the cell strings CS11 and CS12, and each of the driving voltages VSSL2a and VSSL2b may be a low voltage for turning off the string selection transistors SSTa and SSTb of the cell strings CS21 and CS22. In an exemplary embodiment, the driving voltages VSSL2a and VSSL2b may have different levels from each other.

When the first memory block BLK1 is an unselected block, as described above, the block selecting circuit 121b may be turned off, and the block unselecting circuit 121c may be turned on; thus, the off-voltage VOFF may be applied only to some string selection lines SSL1b and SSL2b, and the remaining string selection lines SSL1a and SSL2a may be floated.

Figure 7:
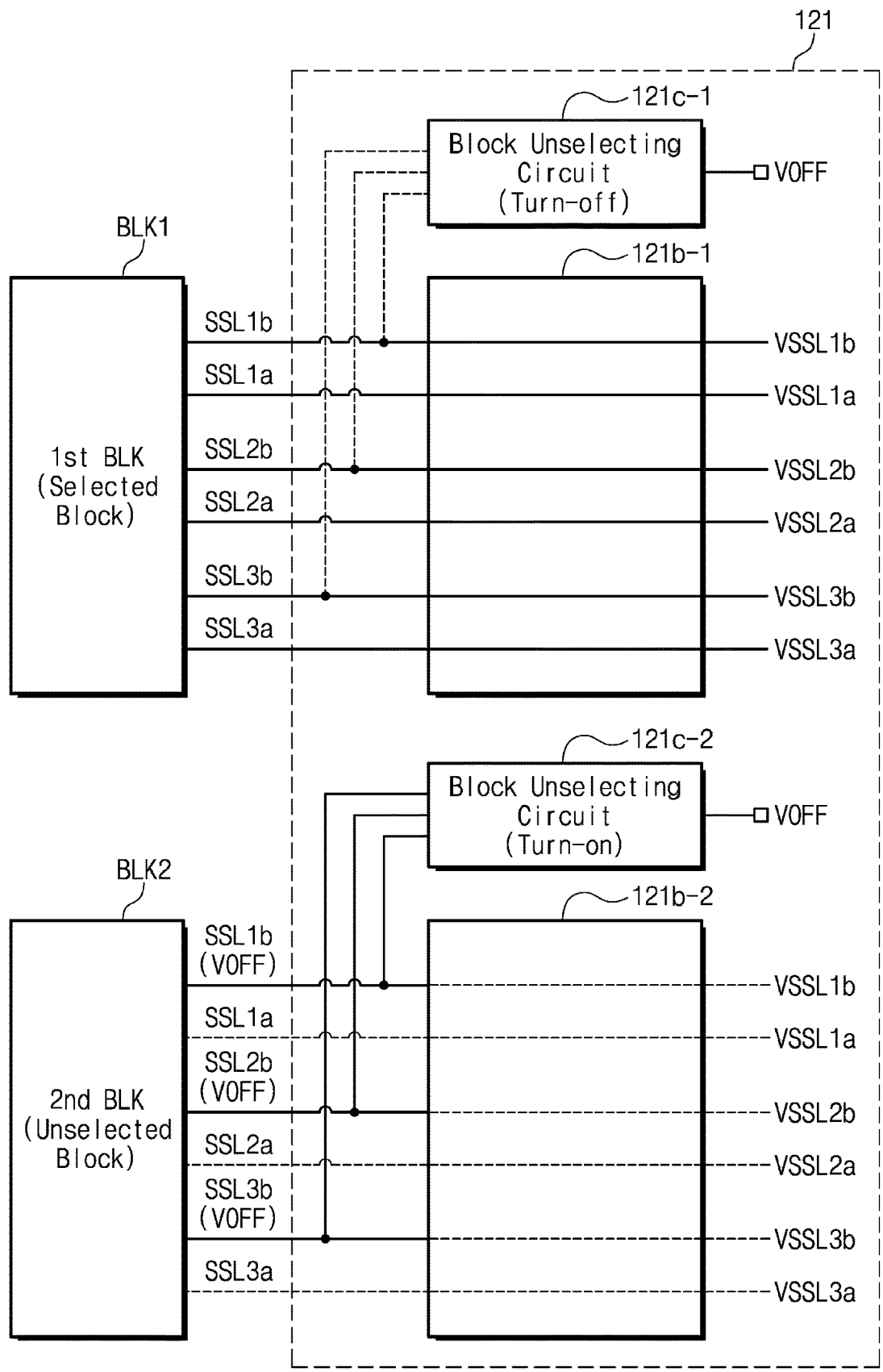
FIG. 7 is a diagram for describing an operation of the nonvolatile memory device of FIG. 1 according to example embodiments.

FIG. 7 is a diagram for describing an operation of the nonvolatile memory device of FIG. 1 according to example embodiments. Operation of the row decoder 121 that are associated with a selected block and an unselected block will be described with reference to FIG. 7. For convenience of description, an additional description associated with the above-described components will be omitted to avoid redundancy.

In an exemplary embodiment, each of the first and second memory blocks BLK1 and BLK2 illustrated in FIG. 7 may include a plurality of cell strings arranged along three rows, and cell strings in the same row may be connected with the same string selection lines. However, the inventive concept is not limited thereto.

Referring to FIG. 7, the row decoder 121 may include first and second block selecting circuits 121b-1 and 121b-2 and first and second block unselecting circuits 121c-1 and 121c-2. The first block selecting circuit 121b-1 may be connected with a plurality of string selection lines SSL1a, SSL1b, SSL2a, SSL2b, SSL3a, and SSL3b of the first memory block BLK1. The first block unselecting circuit 121c-1 may be connected only with some string selection lines (e.g., SSL1b, SSL2b, and SSL3b) of the plurality of string selection lines SSL1a, SSL1b, SSL2a, SSL2b, SSL3a, and SSL3b of the first memory block BLK1.

The second block selecting circuit 121b-2 may be connected with a plurality of string selection lines SSL1a, SSL1b, SSL2a, SSL2b, SSL3a, and SSL3b of the second memory block BLK2. The second block unselecting circuit 121c-2 may be connected only with some string selection lines (e.g., SSL1b, SSL2b, and SSL3b) of the plurality of string selection lines SSL1a, SSL1b, SSL2a, SSL2b, SSL3a, and SSL3b of the second memory block BLK2.

For brevity of illustration and convenience of description, string selection lines connected with the first and second memory blocks BLK1 and BLK2 are marked by the same reference numerals, but the inventive concept is not limited thereto. String selection lines of the first memory block BLK1 may be physically separated from string selection lines of the second memory block BLK2.

For brevity of illustration, only string selection lines connected with the first and second memory blocks BLK1 and BLK2 are illustrated, but the inventive concept is not limited thereto. For example, the first memory block BLK1 and the first block selecting circuit 121b-1 or the second memory block BLK2 and the second block selecting circuit 121b-2 may be further connected with various lines (e.g., DWL, WL, and GSL) described above.

For convenience of description, it is assumed that the first memory block BLK1 is a selected block and the second memory block BLK2 is an unselected block. In this case, as described above, the first block selecting circuit 121b-1 that is connected with the first memory block BLK1 being a selected block is turned on. In this case, as illustrated in FIG. 7, the corresponding voltages VSSL1b, VSSL1a, VSSL2b, VSSL2a, VSSL3b, and VSSL3a may be respectively provided to the string selection lines (e.g., SSL1b, SSL1a, SSL2b, SSL2a, SSL3b, and SSL3a) of the first memory block BLK1 through the first block selecting circuit 121b-1.

The second block selecting circuit 121b-2 that is connected with the second memory block BLK2 being an unselected block is turned off. In this case, as illustrated in FIG. 7, the string selection lines SSL1b, SSL1a, SSL2b, SSL2a, SSL3b, and SSL3a of the second memory block BLK2 may be floated by the second block selecting circuit 121b-2, or corresponding voltages (e.g., VSSL1b, VSSL1a, VSSL2b, VSSL2a, VSSL3b, and VSSL3a) may not be provided or may be blocked by the second block selecting circuit 121b-2.

In this case, as the second block unselecting circuit 121c-2 connected with some string selection lines SSL1b, SSL2b, and SSL3b of the second memory block BLK2 being an unselected block is turned on, the off-voltage VOFF may be provided to some string selection lines SSL1b, SSL2b, and SSL3b of the second memory block BLK2. As such, even though the second memory block BLK2 being an unselected block shares a bit line with the first memory block BLK1, a voltage of the shared bit line may not be applied to the second memory block BLK2.

Also, even though various voltages provided to the first and second block selecting circuits 121b-1 and 121b-2 are shared, an operation may not be performed in the second memory block BLK2 because the various voltages are blocked by the second block selecting circuit 121b-2.

As described above, according to an embodiment of the inventive concept, a nonvolatile memory device may apply the off-voltage VOFF only to some string selection lines of a plurality of string selection lines connected with an unselected memory block, thus preventing an abnormal operation of the unselected memory block. Because a block unselecting circuit is connected only with some string selection lines of a plurality of string selection lines, even though the number of string selection transistors or the number of string selection lines increases, the size of a row decoder may decrease.

In an exemplary embodiment, a string selection line, to which an off-voltage is applied, from among a plurality of string selection lines connected with one memory block may be a string selection line connected with a string selection transistor, which is immediately adjacent to a bit line, from among string selection transistors connected to the plurality of string selection lines. Alternatively, a string selection line, to which an off-voltage is applied, from among a plurality of string selection lines connected with one memory block may be a string selection line connected with a string selection transistor, which is positioned on the uppermost level from a substrate, from among string selection transistors connected to the plurality of string selection lines.

Figure 8:
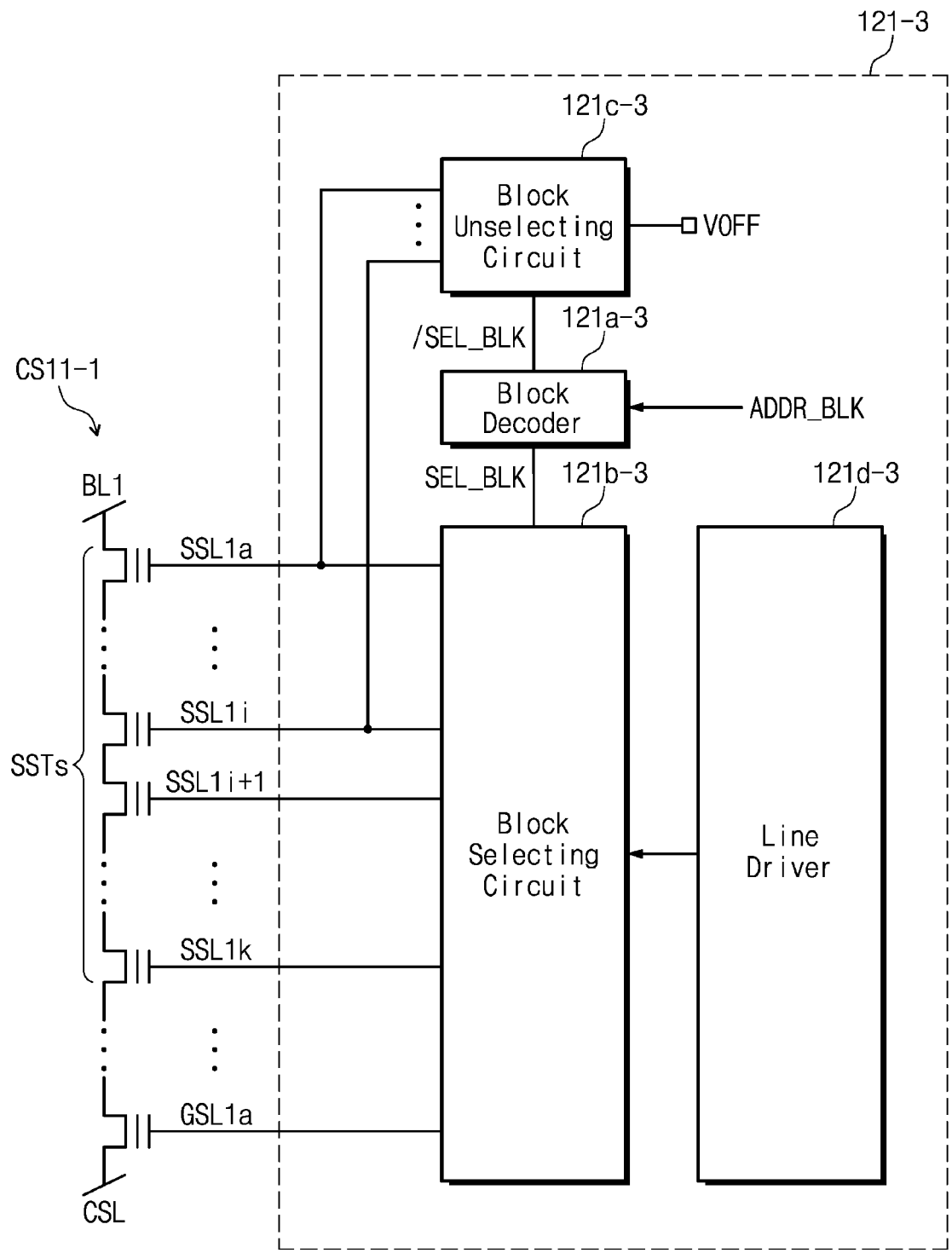
FIG. 8 is a diagram illustrating a row decoder of the nonvolatile memory device of FIG. 1 according to example embodiments.

FIG. 8 is a diagram illustrating an example of the row decoder of FIG. 1 according to example embodiments. For brevity of illustration and for convenience of description, with regard to the same components, an additional description will be omitted to avoid redundancy.

Referring to FIGS. 1 and 8, a row decoder 121-3 may include a block decoder 121a-3, a block selecting circuit 121b-3, a block unselecting circuit 121c-3, and a line driver 121d-3. The block decoder 121a-3, the block selecting circuit 121b-3, and the line driver 121d-3 are described above, and thus, an additional description will be omitted to avoid redundancy.

Unlike the above embodiments, in an embodiment of FIG. 8, a cell strings CS11-1 may include a plurality of string selection transistors SSTs. The plurality of string selection transistors SSTs may be connected with string selection lines SSL1a to SSL1k, respectively.

The block unselecting circuit 121c-3 may be connected with some string selection lines SSL1a to SSL1i of the plurality of string selection lines SSL1a to SSL1k. For example, when a memory block including the cell strings CS11-1 is an unselected block, the block unselecting circuit 121c-3 may be configured to provide the off-voltage VOFF to some string selection lines SSL1a to SSL1i of the plurality of string selection lines SSL1a to SSL1k.

In an exemplary embodiment, the number of some string selection lines SSL1a to SSL1i connected with the block unselecting circuit 121c may be more than the number of the remaining string selection lines SSL1i+1 to SSL1k.

An example is illustrated in FIG. 8 as the plurality of string selection transistors SSTs and the plurality of string selection lines SSL1a to SSL1k are connected in a 1:1 correspondence, but the inventive concept is not limited thereto. For example, the number of the plurality of string selection transistors SSTs may be "m" (here, m being a positive integer), and the number of the plurality of string selection lines SSL1a to SSL1k may be "k" (here, "k" being an integer less than "m"). For example, one string selection line may be shared by at least two or more string selection transistors.

Figure 9A:
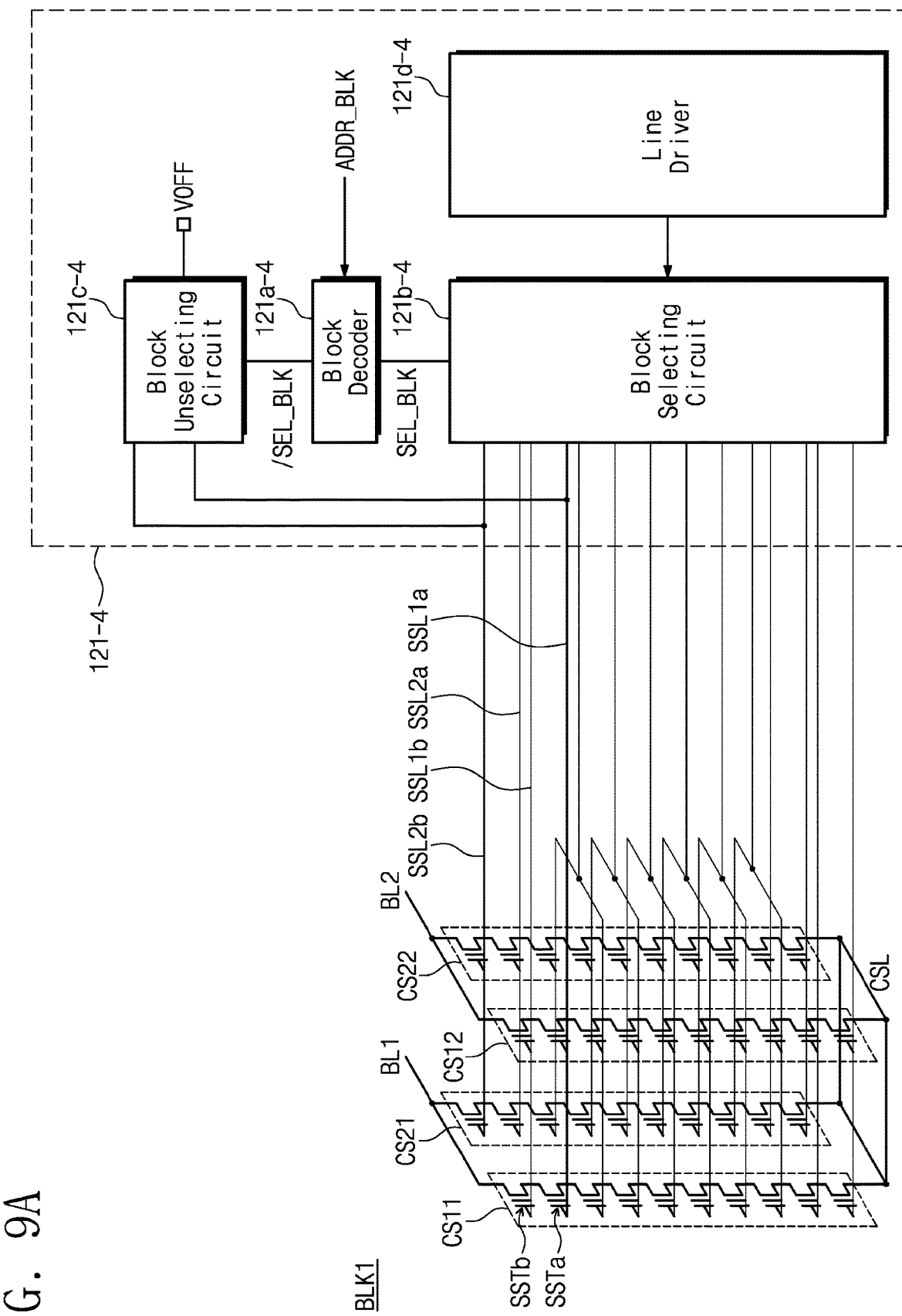
FIG. 9A is a diagram illustrating a row decoder of the nonvolatile memory device of FIG. 1 according to example embodiments.
Figure 9B:
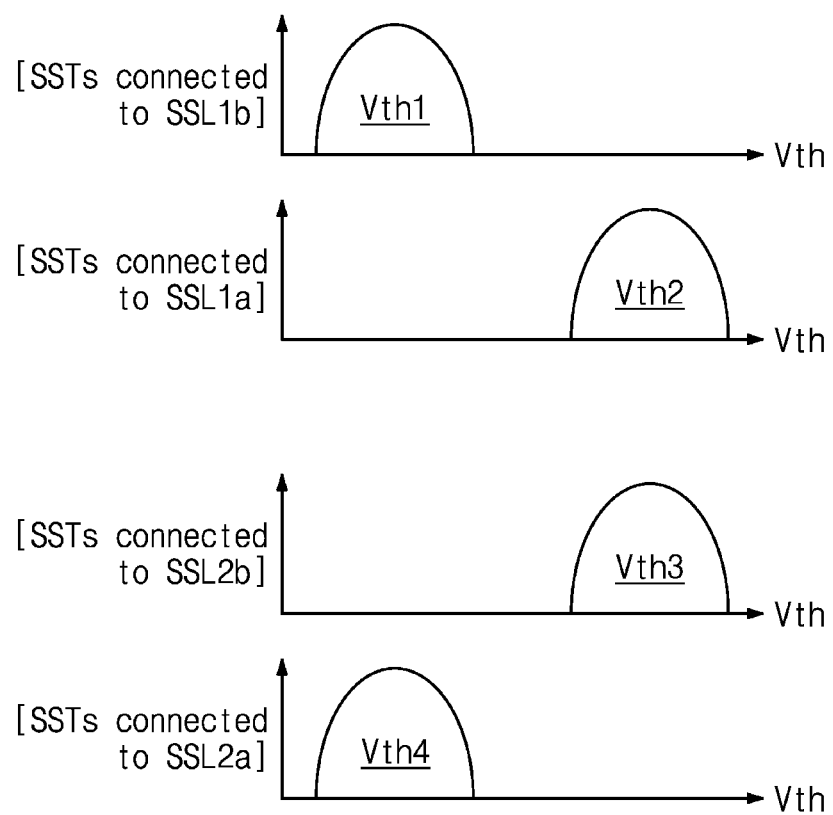
FIG. 9B is a diagram for describing a configuration of the row decoder of FIG. 9A according to example embodiments.

FIG. 9A is a diagram illustrating an example of the row decoder of FIG. 1 according to example embodiments. FIG. 9B is a diagram for describing a configuration of the row decoder of FIG. 9A according to example embodiments. For brevity of illustration and convenience of description, components that are unnecessary to describe a row decoder 121-4 are omitted, and thus, an additional description will be omitted to avoid redundancy.

Referring to FIGS. 1, 2, 9A, and 9B, a row decoder 121-4 may include a block decoder 121a-4, a block selecting circuit 121b-4, a block unselecting circuit 121c-4, and a line driver 121d-4. The block decoder 121a-4, the block selecting circuit 121b-4, and the line driver 121d-4 are described above, and thus, an additional description will be omitted to avoid redundancy.

The block unselecting circuit 121c-4 may be connected with specific string selection lines of the plurality of string selection lines SSL1a, SSL1b, SSL2a, and SSL2b. For example, the block unselecting circuit 121c-4 may be connected with specific string selection lines SSL1a and SSL2b of the plurality of string selection lines SSL1a, SSL1b, SSL2a, and SSL2b. In an exemplary embodiment, the specific string selection lines SSL1a and SSL2b connected with the block unselecting circuit 121c may be determined based on threshold voltages of the string selection transistors SSTa and SSTb.

In detail, as illustrated in FIG. 9B, string selection transistors connected with the string selection line SSL1b may form a first threshold voltage distribution Vth1, and string selection transistors connected with the string selection line SSL1a may form a second threshold voltage distribution Vth2. In this case, the second threshold voltage distribution Vth2 may be higher in level than the first threshold voltage distribution Vth1. For example, a lower limit value or an upper limit value of the second threshold voltage distribution Vth2 may be higher than a lower limit value or an upper limit value of the first threshold voltage distribution Vth1.

Likewise, as illustrated in FIG. 9B, string selection transistors connected with the string selection line SSL2b may form a third threshold voltage distribution Vth3, and string selection transistors connected with the string selection line SSL2a may form a fourth threshold voltage distribution Vth4. In this case, the third threshold voltage distribution Vth3 may be higher in level than the fourth threshold voltage distribution Vth4. For example, a lower limit value or an upper limit value of the third threshold voltage distribution Vth3 may be higher than a lower limit value or an upper limit value of the fourth threshold voltage distribution Vth4.

A string selection line (e.g., SSL1a or SSL2b in an embodiment of FIG. 9B), which is connected with string selection transistors having the highest threshold voltage distribution, from among string selection lines (e.g., SSL1b and SSL1a or SSL2b and SSL2a) positioned at the same row may be connected with the block unselecting circuit 121c-4.

In some examples, threshold voltages of string selection transistors that are connected with string selection lines connected with the block unselecting circuit 121c may be greater than threshold voltages of string selection transistors connected with the remaining string selection lines do not connected with the block unselecting circuit 121c.

In an exemplary embodiment, string selection transistors connected with string selection lines connected with the block unselecting circuit 121c-4 may be programmed to have a threshold voltage of a reference value or higher.

Figure 10:
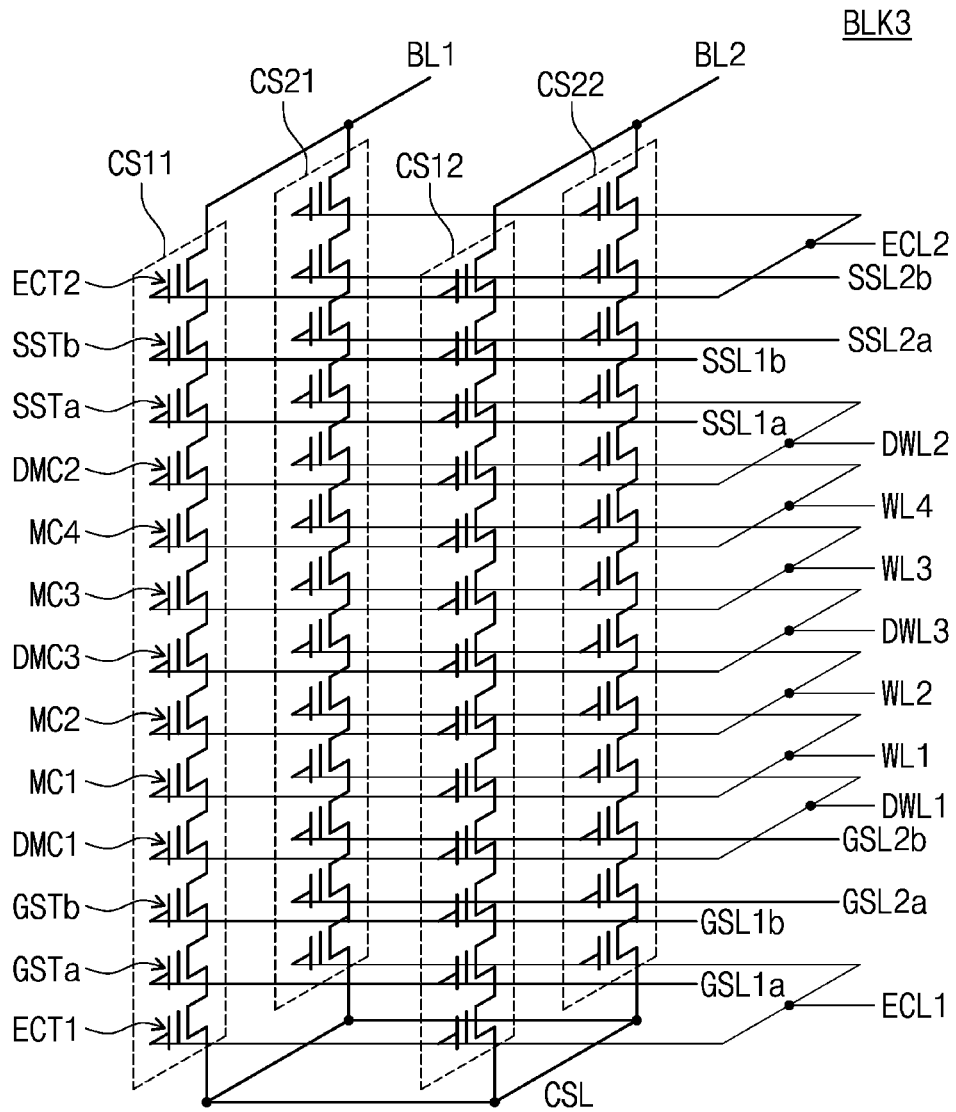
FIG. 10 is a circuit diagram illustrating a third memory block according to an embodiment of the inventive concept.

FIG. 10 is a circuit diagram illustrating a third memory block according to an embodiment of the inventive concept. For convenience of description, an additional description associated with the above-described components will be omitted to avoid redundancy. In an exemplary embodiment, a third memory block BLK3 of FIG. 10 is an exemplary structure of a three-dimensional memory block, and the embodiment of the inventive concept is not limited thereto. In an exemplary embodiment, each of memory blocks included in a memory cell array may have a structure of the first memory block BLK1 of FIG. 2 or may have a structure of the third memory block BLK3 of FIG. 10.

Referring to FIG. 10, the third memory block BLK3 may include a plurality of cell strings CS11, CS12, CS21, and CS22. The plurality of cell strings CS11, CS12, CS21, and CS22 may be arranged in a row direction and a column direction. Cell strings belonging to the same column may be connected to the same bit line. For example, the cell strings CS11 and CS21 may be connected with a first bit line BL1, and the cell strings CS12 and CS22 may be connected with a second bit line BL2.

Each of the plurality of cell strings CS11, CS12, CS21, and CS22 may include a plurality of cell transistors. In each cell string, the plurality of cell transistors may be connected in series between a corresponding bit line and the common source line CSL. In an exemplary embodiment, in each cell string, the plurality of cell transistors may include string selection transistor SSTa and SSTb, memory cells MC1 to MC4, dummy memory cells DMC1 to DMC3, ground selection transistors GSTa and GSTb, and erase control transistors ECT1 and ECT2. The cell transistors in each cell string may be connected with corresponding lines (e.g., SSL1a, SSL1b, SSL2a, SSL2b, DWL1-DWL3, WL1-WL4, GSL1a, GSL1b, GSL2a, GSL2b, ECL1, and ECL2), respectively. The string selection transistor SSTa and SSTb, the memory cells MC1 to MC4, the dummy memory cells DMC1 and DMC2, and the ground selection transistors GSTa and GSTb are described with reference to FIG. 2, and thus, an additional description will be omitted to avoid redundancy.

Unlike the first memory block BLK1 of FIG. 2, the third memory block BLK3 of FIG. 10 may further include the erase control transistors ECT1 and ECT2 and the third dummy memory cell DMC3.

The first erase control transistor ECT1 may be interposed between the serially-connected ground selection transistors GSTa and GSTb and the common source line CSL and may be connected with a first erase control line ECL1. The second erase control transistor ECT2 may be interposed between the serially-connected string selection transistors SSTa and SSTb and a bit line BL1 or BL2 and may be connected with a second erase control line ECL2. The first and second erase control transistors ECT1 and ECT2 may be controlled by the first and second erase control lines ECL1 and ECL2, respectively. In an exemplary embodiment, the first and second erase control transistors ECT1 and ECT2 may be configured to control a gate induced drain leakage (GIDL) current when the third memory block BLK3 is erased.

The third dummy memory cell DMC3 may be positioned between the memory cells MC1 to MC4 stacked in a direction perpendicular to a substrate and may be connected with a third dummy word line DWL3. For example, the third dummy memory cell DMC3 may be interposed between the second and third memory cells MC2 and MC3. In an exemplary embodiment, when the third memory block BLK3 has a multi-stacked structure, the third dummy memory cell DMC3 may be formed in a connecting layer between a lower structure (e.g., a structure including ECT1, GSTa, GSTb, DMC1, MC1, and MC2) and an upper structure (e.g., ECT2, SSTa, SSTb, DMC2, MC4, and MC3).

In an exemplary embodiment, the third memory block BLK3 of FIG. 10 is exemplary, and the inventive concept is not limited thereto. For example, the third memory block BLK3 may not include at least one of the components illustrated in FIG. 10. Alternatively, the third memory block BLK3 may further include additional components. For example, the third memory block BLK3 illustrated in FIG. 10 is exemplary, and it may be understood that a structure of a memory block may be variously changed or modified.

FIGS. 11A to 11D are diagrams illustrating row decoders according to embodiments of the inventive concept. For convenience of description, configurations of row decoders 221-1, 221-2, 221-3, and 221-4 will be described with reference to the third memory block BLK3 of FIG. 10, and an additional description associated with the components described above will be omitted to avoid redundancy. In FIGS. 11A to 11D, for clarity of drawing, a line connected with a block unselecting circuit from among various lines connected with the third memory block BLK3 is illustrated by a solid line.

As illustrated in FIGS. 11A to 11D, the row decoder 221-1, 221-2, 221-3, or 221-4 may be connected with the third memory block BLK3 through various lines. The row decoder 221-1 221-1, 221-2, 221-3, or 221-4 may include a block decoder 221a-1, 221a-2, 221a-3, or 221a-4, a block selecting circuit 221b-1, 221b-2, 221b-3, or 221b-4, a block unselecting circuit 221c-1, 221c-2, 221c-3, or 221c-4, and a line driver 221d-1, 221d-2, 221d-3, or 221d-4. The block decoders 221a-1, 221a-2, 221a-3, and 221a-4, the block selecting circuits 221b-1, 221b-2, 221b-3, and 221b-4, and the line drivers 221d-1, 221d-2, 221d-3, and 221d-4 are similar to the components described above, and thus, an additional description will be omitted to avoid redundancy.

Figure 11A:
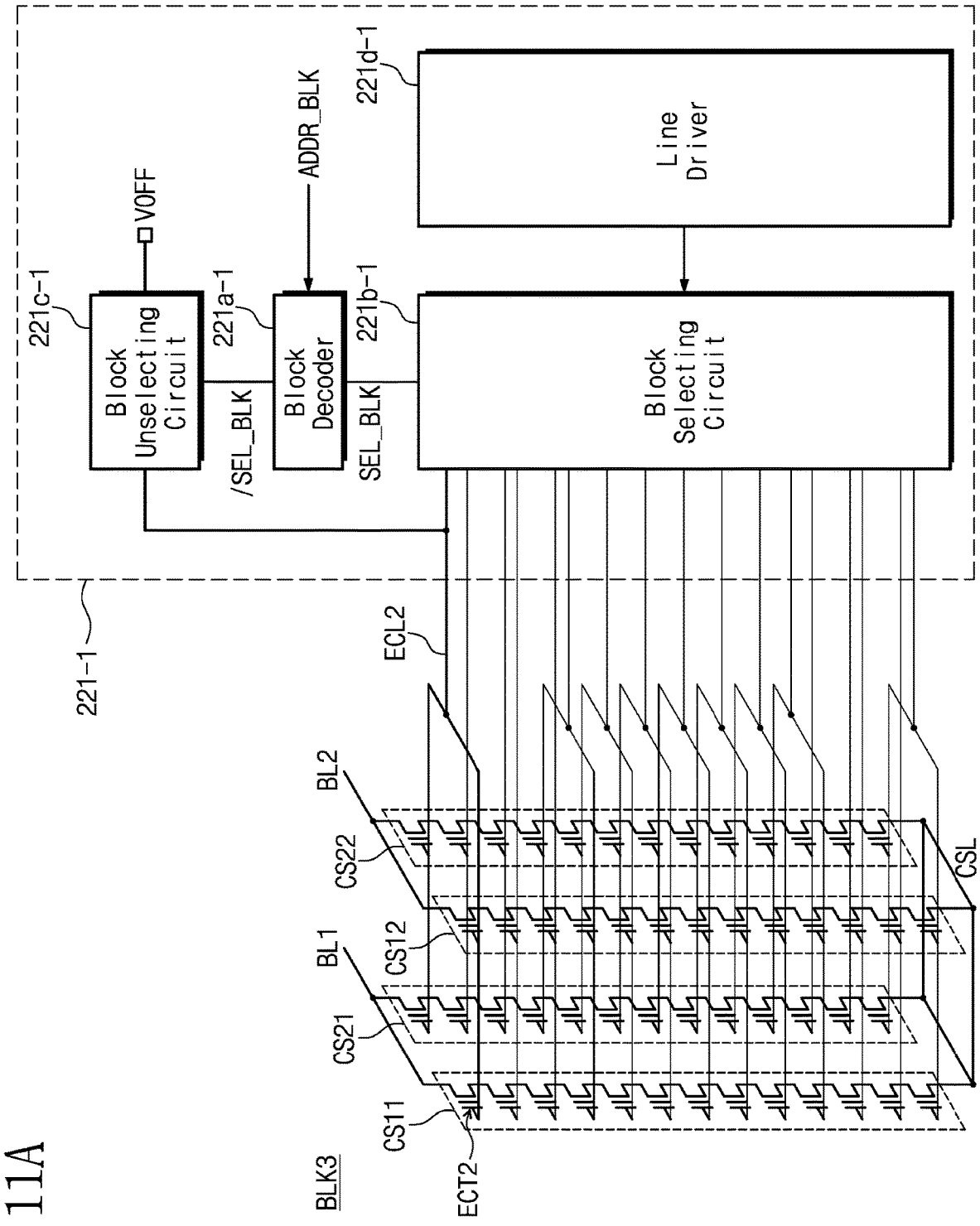
FIGS. 11A to 11D are diagrams illustrating row decoders according to embodiments of the inventive concept.

As illustrated in FIG. 11A, the block unselecting circuit 221c-1 may be connected with the second erase control line ECL2 and may be configured to provide the off-voltage VOFF to the second erase control line ECL2 when the third memory block BLK3 is an unselected block. For example, unlike the above embodiments, the block unselecting circuit 221c-1 of FIG. 11A may provide the off-voltage VOFF to the second erase control line ECL2 positioned above string selection lines, instead of the string selection lines. For example, the block unselecting circuit 221c-1 may not be connected to any string selection line of the third memory block BLK3. In an exemplary embodiment, the second erase control line ECL2 may indicate a line that is connected in common to cell transistors (i.e., the second erase control transistors ECT2) immediately adjacent to the bit lines BL1 and BL2.

Figure 11B:
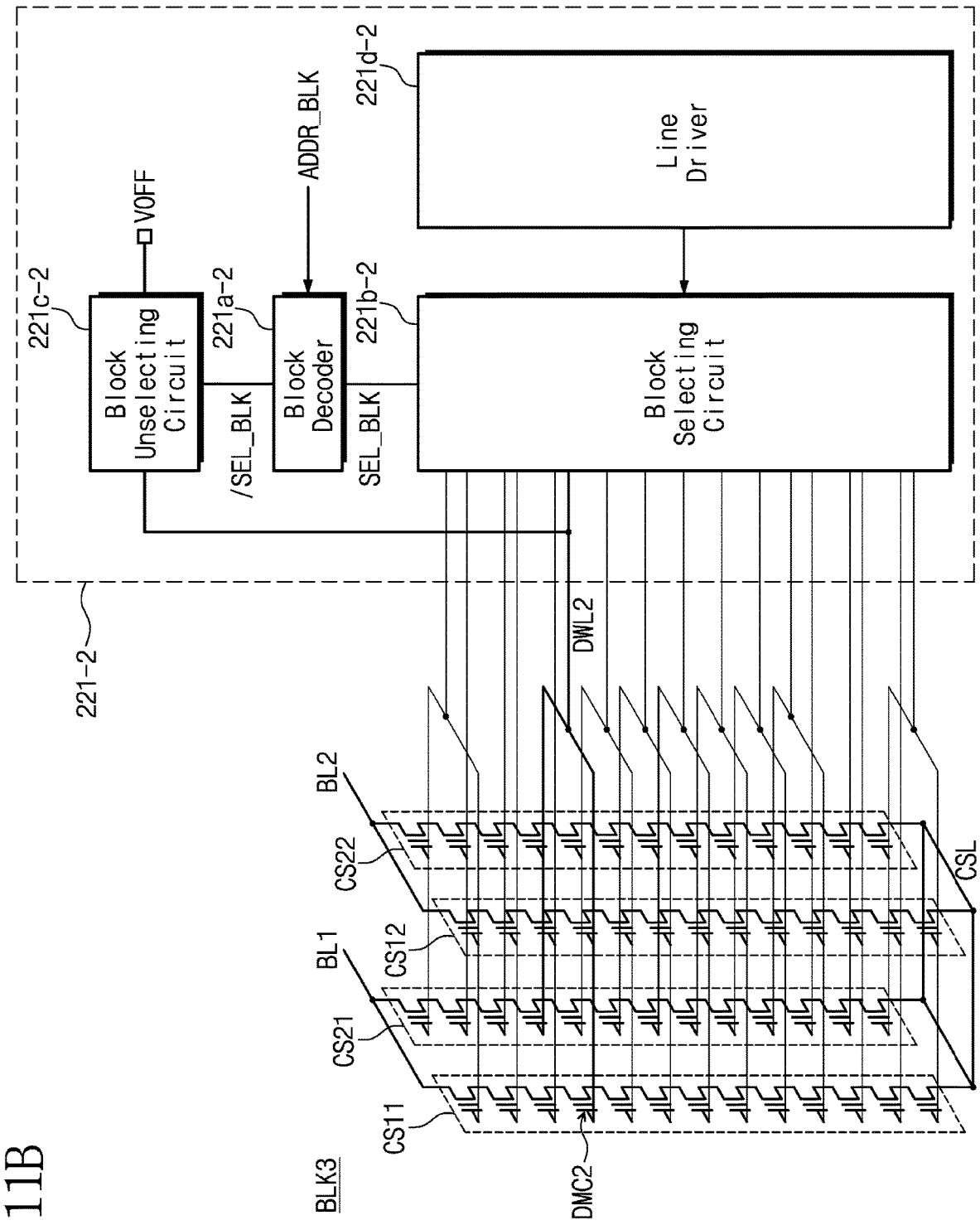

As illustrated in FIG. 11B, the block unselecting circuit 221c-2 may be connected with the second dummy word line DWL2 and may be configured to provide the off-voltage VOFF to the second dummy word line DWL2 when the third memory block BLK3 is an unselected block. For example, unlike the above embodiments, the block unselecting circuit 221c-2 of FIG. 11B may provide the off-voltage VOFF to the second dummy word line DWL2 interposed between string selection lines and word lines, instead of string selection lines.

Figure 11C:
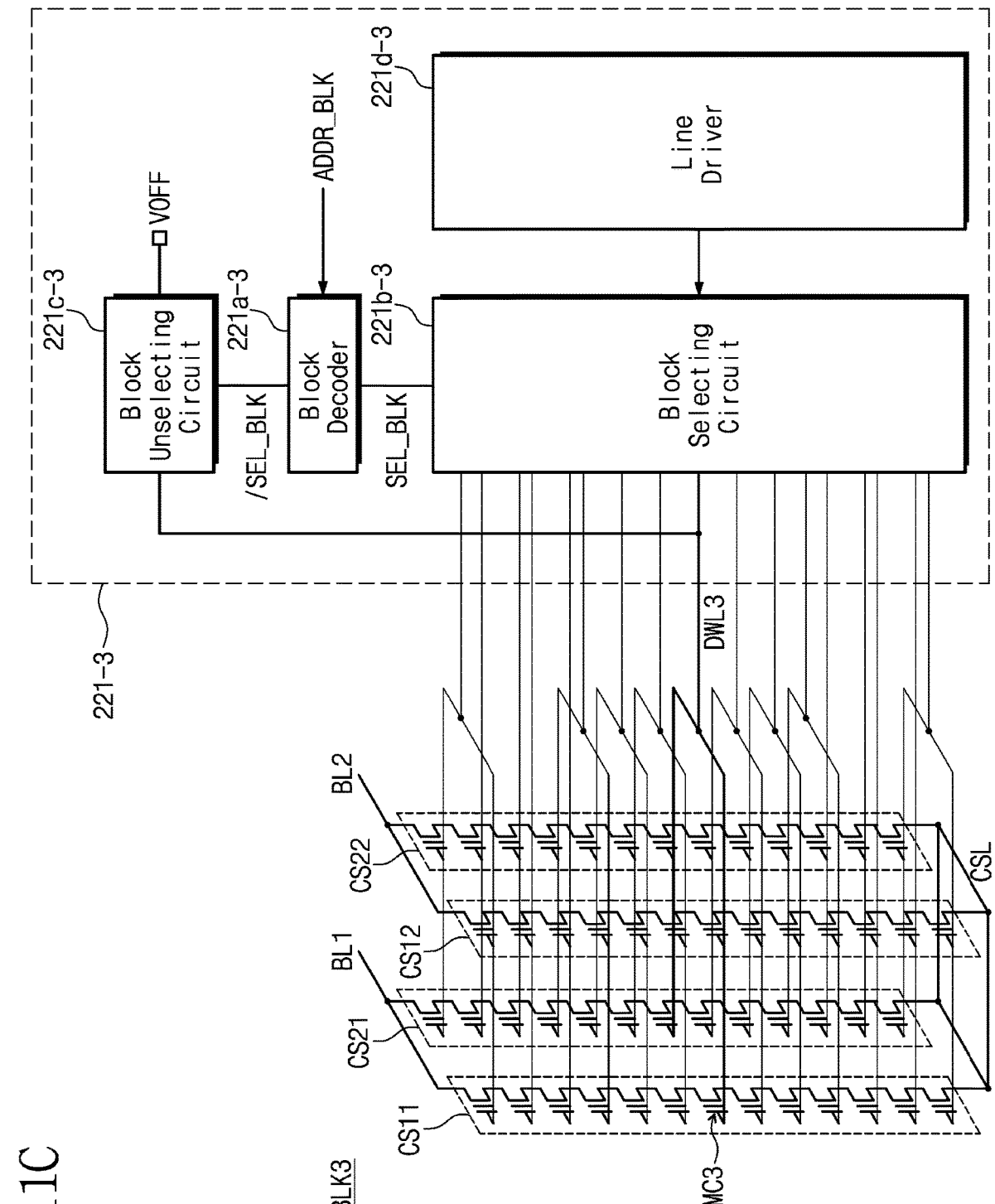

As illustrated in FIG. 11C, the block unselecting circuit 221c-3 may be connected with the third dummy word line DWL3 and may be configured to provide the off-voltage VOFF to the third dummy word line DWL3 when the third memory block BLK3 is an unselected block. For example, unlike the above embodiments, the block unselecting circuit 221c-3 of FIG. 11C may provide the off-voltage VOFF to the third dummy word line DWL3 interposed between word lines, instead of string selection lines.

Figure 11D:
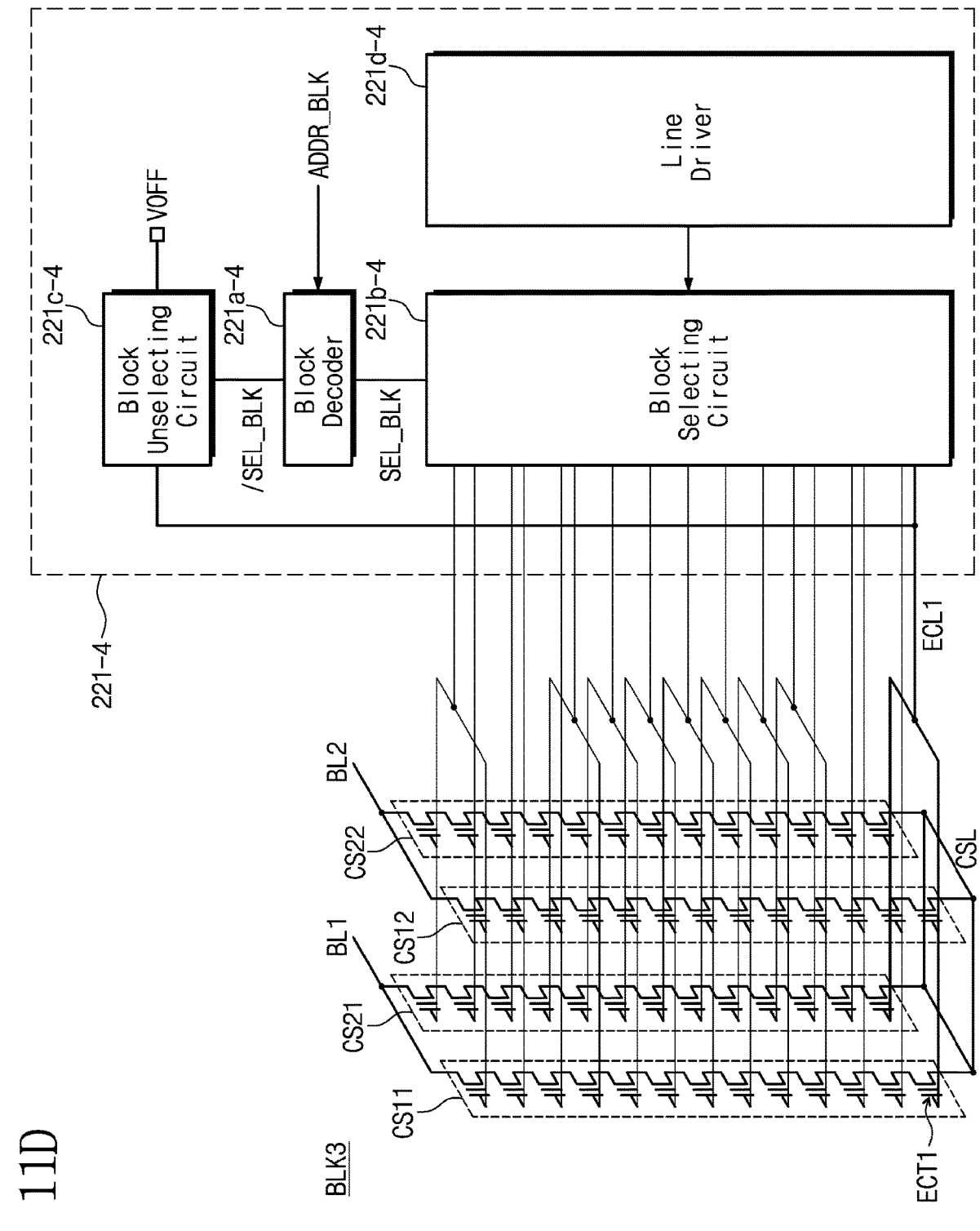

As illustrated in FIG. 11D, the block unselecting circuit 221c-4 may be connected with the first erase control line ECL1 and may be configured to provide the off-voltage VOFF to the first erase control line ECL1 when the third memory block BLK3 is an unselected block. For example, unlike the above embodiments, the block unselecting circuit 221c-4 of FIG. 11D may provide the off-voltage VOFF to the first erase control line ECL1 positioned below ground selection lines, instead of string selection lines. In an exemplary embodiment, the first erase control line ECL1 may indicate a line that is connected in common to the first erase control transistors ECT1 immediately adjacent to the common source line CSL.

As described above, a row decoder of a nonvolatile memory device according to an embodiment of the inventive concept may provide the off-voltage VOFF only to a part of various signal lines connected with an unselected block, in compliance with various ways to implement a memory cell array. In this case, the number of transistors of a block unselecting circuit included in the row decoder may decrease, thus reducing the size of the nonvolatile memory device. This makes it possible to implement the nonvolatile memory device with the reduced size and the reduced costs.

Figure 12:
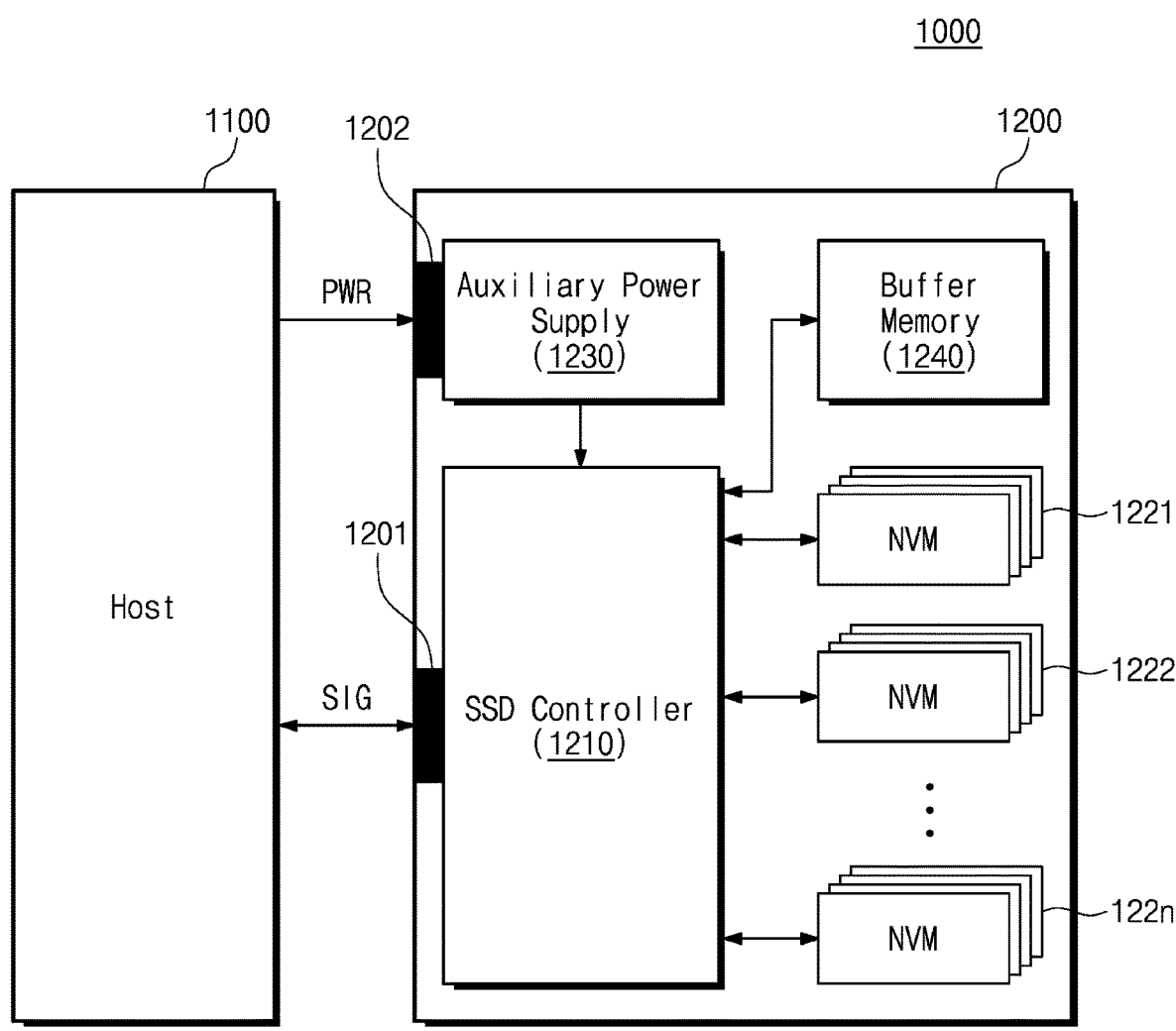
FIG. 12 is a block diagram illustrating a storage system including a nonvolatile memory device according to embodiments of the inventive concept.

FIG. 12 is a block diagram illustrating a storage system including a nonvolatile memory device according to an embodiment of the inventive concept. Referring to FIG. 12, a storage system 1000 may include a host 1100 and a storage device 1200.

The storage device 1200 exchanges a signal SIG with the host 1100 through a signal connector 1201 and is supplied with a power PWR through a power connector 1202. The storage device 1200 includes a solid state drive (SSD) controller 1210, a plurality of nonvolatile memories 1221 to 122n, an auxiliary power supply 1230, and a buffer memory 1240. In an exemplary embodiment, each of the nonvolatile memories 1221 to 122n may include any one of nonvolatile memory devices described with reference to FIGS. 1 to 8, 9A, 9B, 10, and 11A to 11D.

The SSD controller 1210 may control the nonvolatile memories 1221 to 122n in response to the signal SIG received from the host 1100. The plurality of nonvolatile memories 1221 to 122n may operate under control of the SSD controller 1210. The auxiliary power supply 1230 is connected with the host 1100 through the power connector 1202. The auxiliary power supply 1230 may be charged by the power PWR from the host 1100. When the power PWR is not smoothly supplied from the host 1100, the auxiliary power supply 1230 may power the storage device 1200.

According to embodiments of the inventive concept, the size of a row decoder including a block unselecting circuit may decrease by connecting the block unselecting circuit only with some of string selection lines of a memory block. Accordingly, the nonvolatile memory device having reduced costs is provided.

Also, the size of the row decoder including the block unselecting circuit may decrease by connecting the block unselecting circuit only with some signal lines (e.g., an erase control line, a dummy word line, etc.) of various signal lines connected with the memory block. Accordingly, the nonvolatile memory device having reduced costs is provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A nonvolatile memory device comprising:
a first memory block including a plurality of cell transistors interconnected with a plurality of ground selection lines, a plurality of word lines, and a plurality of string selection lines, which are stacked in a direction perpendicular to a substrate;
a block selecting circuit connected with the plurality of ground selection lines, the plurality of word lines, and the plurality of string selection lines, and configured to provide corresponding driving voltages to the plurality of ground selection lines, the plurality of word lines, and the plurality of string selection lines in response to a block selection signal, respectively; and
a block unselecting circuit connected only with specific string selection lines of the plurality of string selection lines, and configured to provide an off-voltage only to the specific string selection lines in response to a block un-selection signal,
wherein the number of the specific string selection lines is smaller than the number of the plurality of string selection lines.

2. The nonvolatile memory device of claim 1, further comprising:
a block decoder configured to receive an address from an external device and to output the block selection signal and the block un-selection signal based on the received address.

3. The nonvolatile memory device of claim 2, wherein, in response to an activating of the block un-selection signal, the nonvolatile memory device is configured such that the block unselecting circuit provides the off-voltage to the specific string selection lines, and
wherein, in response to a deactivating of the block selection signal, the block selecting circuit floats remaining string selection lines of the plurality of string selection lines other than the specific string selection lines.

4. The nonvolatile memory device of claim 1, wherein the off-voltage is any one of a ground voltage and a negative voltage.

5. The nonvolatile memory device of claim 1, wherein the first memory block includes a first cell string and a second cell string each interposed between the substrate and a first bit line,
wherein the first cell string includes:
a first ground selection transistor of the plurality of cell transistors, the first ground selection transistor stacked in a direction perpendicular to the substrate and connected with a first ground selection line of the plurality of ground selection lines;
first memory cells of the plurality of cell transistors, the first memory cells positioned above the first ground selection transistor, stacked in the direction perpendicular to the substrate, and respectively connected with the plurality of word lines; and
first string selection transistors of the plurality of cell transistors, the first string selection transistors positioned above the first memory cells, stacked in the direction perpendicular to the substrate, and respectively connected with first string selection lines of the plurality of string selection lines, and
wherein the second cell string includes:
a second ground selection transistor of the plurality of cell transistors, the second ground selection transistor stacked in the direction perpendicular to the substrate and connected with a second ground selection line of the plurality of ground selection lines;
second memory cells of the plurality of cell transistors, the second memory cells positioned above the second ground selection transistor, stacked in the direction perpendicular to the substrate, and respectively connected with the plurality of word lines; and
second string selection transistors of the plurality of cell transistors, the second string selection transistors positioned above the second memory cells, stacked in the direction perpendicular to the substrate, and respectively connected with second string selection lines of the plurality of string selection lines.

6. The nonvolatile memory device of claim 5, wherein the specific string selection lines include a first part of the first string selection lines and a second part of the second string selection lines.

7. The nonvolatile memory device of claim 6, wherein the first part of the first string selection lines is connected to a first part of the first string selection transistors positioned closer to the first bit line than a rest of the first string selection transistors other than the first part of the first string selection transistors, and
wherein the second part of the second string selection lines is connected to a second part of the second string selection transistors positioned closer to the first bit line than a rest of the second string selection transistors other than the second part of the second string selection transistors.

8. The nonvolatile memory device of claim 6, wherein the number of the first string selection lines is "M",
wherein the number of string selection transistors connected with the first part of the first string selection lines from among the first string selection transistors is "N",
wherein each of "M" and "N" is a positive integer and "N" is smaller than "M",
wherein the number of the second string selection lines is "M", and
wherein the number of string selection transistors connected with the second part of the second string selection lines from among the second string selection transistors is "N".

9. The nonvolatile memory device of claim 6, wherein threshold voltages of string selection transistors connected with the first part of the first string selection lines from among the first string selection transistors are greater than threshold voltages of string selection transistors, which are connected with remaining string selection lines of the first string selection lines other than the first part of the first string selection lines, from among the first string selection transistors, and
wherein threshold voltages of string selection transistors connected with the second part of the second string selection lines from among the second string selection transistors are greater than threshold voltages of string selection transistors, which are connected with remaining string selection lines of the second string selection lines other than the second part of the second string selection lines, from among the second string selection transistors.

10. The nonvolatile memory device of claim 1, wherein the block unselecting circuit includes a plurality of non-selection path transistors configured to provide the off-voltage to the specific string selection lines in response to the block un-selection signal, and
wherein the number of the plurality of non-selection path transistors is smaller than the number of the plurality of string selection lines.

11. A nonvolatile memory device comprising:
a first cell string including a plurality of first cell transistors connected in series between a common source line and a first bit line and stacked each other in a direction perpendicular to a substrate;
a second cell string including a plurality of second cell transistors connected in series between the common source line and the first bit line and stacked each other in the direction perpendicular to the substrate;
a block selecting circuit connected with the first cell string and the second cell string through a plurality of signal lines, and configured to provide corresponding driving voltages to the plurality of signal lines in response to a block selection signal; and
a block unselecting circuit connected only with specific signal lines of the plurality of signal lines, and configured to provide an off-voltage to the specific signal lines in response to a block un-selection signal,
wherein remaining signal lines of the plurality of signal lines other than the specific signal lines include at least one first string selection line connected with the first cell string and at least one second string selection line connected with the second cell string.

12. The nonvolatile memory device of claim 11, wherein the specific signal lines include:
a first signal line connected with a first cell transistor immediately adjacent to the first bit line from among the plurality of first cell transistors; and
a second signal line connected with a second cell transistor immediately adjacent to the first bit line from among the plurality of second cell transistors.

13. The nonvolatile memory device of claim 12, wherein the plurality of first cell transistors include a plurality of first string selection transistors,
wherein the plurality of second cell transistors include a plurality of second string selection transistors,
wherein the first cell transistor is one of the plurality of first string selection transistors, and
wherein the second cell transistor is one of the plurality of second string selection transistors.

14. The nonvolatile memory device of claim 12, wherein the plurality of first cell transistors include a first erase control transistor,
wherein the plurality of second cell transistors include a second erase control transistor,
wherein the first cell transistor is the first erase control transistor, and
wherein the second cell transistor is the second erase control transistor.

15. The nonvolatile memory device of claim 14, wherein the first signal line and the second signal line are an erase control line connected in common with the first erase control transistor and the second erase control transistor.

16. The nonvolatile memory device of claim 11, wherein the first cell string and the second cell string are included in a first memory block,
wherein, when the first memory block is a selected block, the nonvolatile memory device is configured such that the block selecting circuit provides corresponding driving voltages to the plurality of signal lines, and the block unselecting circuit floats the specific signal lines, and
wherein, when the first memory block is an unselected block, the nonvolatile memory device is configured such that the block selecting circuit floats the plurality of signal lines, and the block unselecting circuit provides the off-voltage to the specific signal lines.

17. The nonvolatile memory device of claim 11, wherein the off-voltage is a ground voltage or a negative voltage.

18. A nonvolatile memory device comprising:
a first memory block including a plurality of cell transistors interconnected with a plurality of string selection lines, a plurality of word lines, and a plurality of ground selection lines, which are stacked in a direction perpendicular to a substrate;
a block decoder configured to activate a block selection signal and a block un-selection signal based on a first address corresponding to the first memory block and a second address that does not correspond to the first memory block, respectively, the first and second addresses receiving from an external device;
a plurality of path transistors configured to provide corresponding driving voltages to the plurality of string selection lines, the plurality of word lines, and the plurality of ground selection lines, respectively in response to the activating of the block selection signal; and
a plurality of non-selection path transistors configured to provide an off-voltage to specific string selection lines of the plurality of string selection lines in response to the activating of the block un-selection signal,
wherein the number of the plurality of non-selection path transistors is smaller than the number of the plurality of string selection lines.

19. The nonvolatile memory device of claim 18, wherein the first memory block includes:
a first cell string connected with a first bit line and including a plurality of first cell transistors connected in series;
a second cell string connected with the first bit line and including a plurality of second cell transistors connected in series;
a third cell string connected with a second bit line and including a plurality of third cell transistors connected in series; and
a fourth cell string connected with the second bit line and including a plurality of fourth cell transistors connected in series,
wherein first string selection lines of the plurality of string selection lines are connected with the first and third cell strings,
wherein second string selection lines of the plurality of string selection lines are connected with the second and fourth cell strings, and
wherein the specific string selection lines include a first part of the first string selection lines and a second part of the second string selection lines.

20. The nonvolatile memory device of claim 19, wherein the first part of the first string selection lines is connected with a cell transistor physically the closest to the first bit line from among the plurality of first cell transistors, and a cell transistor physically the closest to the second bit line from among the plurality of third cell transistors, and wherein the second part of the second string selection lines is connected with a cell transistor physically the closest to the first bit line from among the plurality of second cell transistors, and a cell transistor physically the closest to the second bit line from among the plurality of fourth cell transistors.

* * * * *